(12) United States Patent
Jeon et al.

(10) Patent No.: US 12,113,110 B2
(45) Date of Patent: Oct. 8, 2024

(54) NITRIDE SEMICONDUCTOR DEVICE WITH FIELD EFFECT GATE

(71) Applicant: Samsung Electronics Co., Ltd., Suwon-si (KR)

(72) Inventors: Woochul Jeon, Suwon-si (KR); Jongseob Kim, Seoul (KR); Jaejoon Oh, Seongnam-si (KR); Younghwan Park, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 158 days.

(21) Appl. No.: 17/541,735

(22) Filed: Dec. 3, 2021

(65) Prior Publication Data
US 2023/0006047 A1 Jan. 5, 2023

(30) Foreign Application Priority Data

Jul. 2, 2021 (KR) .......................... 10-2021-0087402

(51) Int. Cl.
*H01L 29/423* (2006.01)
*H01L 27/098* (2006.01)
*H01L 29/20* (2006.01)
*H01L 29/808* (2006.01)

(52) U.S. Cl.
CPC ...... *H01L 29/42316* (2013.01); *H01L 27/098* (2013.01); *H01L 29/808* (2013.01); *H01L 29/2003* (2013.01)

(58) Field of Classification Search
None
See application file for complete search history.

(56) References Cited

U.S. PATENT DOCUMENTS

| 7,671,387 | B2 | 3/2010 | Fujikawa et al. |
| 9,337,279 | B2 | 5/2016 | Ostermaier et al. |
| 10,546,858 | B2 | 1/2020 | Kavalieros et al. |
| 2013/0083567 | A1* | 4/2013 | Imada ............... H01L 29/66462 257/192 |
| 2013/0126942 | A1 | 5/2013 | Nakajima et al. |

(Continued)

FOREIGN PATENT DOCUMENTS

KR 10-0876487 B1 12/2008

OTHER PUBLICATIONS

Korean Office Action dated Aug. 30, 2022 issued in Korean Patent Application No. 10-2021-0087402. English translation has been provided.

(Continued)

*Primary Examiner* — Khaja Ahmad
(74) *Attorney, Agent, or Firm* — Harness, Dickey & Pierce, P.L.C.

(57) ABSTRACT

A nitride semiconductor device having a field effect gate is disclosed. The disclosed nitride semiconductor device includes a high-resistance material layer including a Group III-V compound semiconductor, a first channel control layer on the high-resistance material layer and including a Group III-V compound semiconductor of a first conductivity type, a channel layer on the channel layer control layer and including a nitride semiconductor of a second conductivity type opposite to the first conductivity type, and a gate electrode having a contact of an ohmic contact type with the first channel control layer.

20 Claims, 20 Drawing Sheets

(56) References Cited

U.S. PATENT DOCUMENTS

| | | | |
|---|---|---|---|
| 2014/0175515 A1 | 6/2014 | Then et al. | |
| 2016/0020305 A1* | 1/2016 | Obradovic | H01L 27/0688 |
| | | | 438/157 |
| 2016/0240179 A1 | 8/2016 | Uemura et al. | |
| 2019/0165153 A1* | 5/2019 | Wu | H01L 29/1029 |
| 2019/0348536 A1 | 11/2019 | Kubis et al. | |
| 2020/0373383 A1* | 11/2020 | Zhang | H01L 29/7786 |
| 2021/0036103 A1 | 2/2021 | Babb et al. | |
| 2021/0226022 A1* | 7/2021 | Li | H01L 29/41791 |

OTHER PUBLICATIONS

Li-Cheng et al, "Investigation of GaN Fin-HEMTs with micron scale fin width", GaN Materials and Devices, Proceedings of SPIE 10104, Gallium Nitride Materials and Devices XII, 101041F, pp. 1-7 (2017).

Muhammad et al, "3D GaN nanoarchitecture for field-effect transistors", Micro and Nano Engineering, vol. 3, pp. 59-81 (2019).

Travis J. Anderson et al., "Lateral GaN JFET Devices on 200 mm Engineered Substrates for Power Switching Applications", IEEE 6th Workshop on Wide Bandgap Power Devices and Applications(WiPDA) pp. 14-17 (2018).

Yuhao Zhang et al., "GaN FinFETs and trigate devices for power and RF applications: review and perspective", Semiconductor Science and Technology No. 36, pp. 1-24 (2021).

\* cited by examiner

NITRIDE SEMICONDUCTOR DEVICE WITH FIELD EFFECT GATE

CROSS-REFERENCE TO RELATED APPLICATION

This application is based on and claims priority under 35 U.S.C. § 119 to Korean Patent Application No. 10-2021-0087402, filed on Jul. 2, 2021, in the Korean Intellectual Property Office, the disclosure of which is incorporated by reference herein in its entirety.

BACKGROUND

Some example embodiments relate to nitride semiconductor devices, and more particularly, to nitride semiconductor devices having a field effect gate.

In various power conversion systems, a device that controls the flow of current through on/off switching, for example, a power device, is used/required. In a power conversion system, the efficiency of a power device may influence the efficiency of the entire system.

Due to the physical limitation of silicon and the limitation of the manufacturing process in this case, it is difficult to increase the efficiency of a power device based on silicon. In order to overcome such limitations, researches/developments have been conducted to increase the conversion efficiency by applying a Group III-V series compound semiconductor, such as GaN, to a power device. Recently, a device having a heterojunction structure of a compound semiconductor has been studied.

In order to implement effective turn-off or switching characteristics of the device, it is required/desired to reduce the size of a channel, which may be a difficult process. Alternatively or additionally, it is difficult to obtain epitaxial growth of a heterogeneous material to implement a heterojunction.

SUMMARY

Provided are nitride semiconductor devices having a field effect gate for implementing turn-off or switching characteristics without a heterojunction structure and having no or reduced restriction of a channel size for implementing effective turn-off and/or switching characteristics.

Additional aspects will be set forth in part in the description which follows and, in part, will be apparent from the description, or may be learned by practice of the presented embodiments of the disclosure.

According to some example embodiments, a nitride semiconductor device includes a high-resistance material layer including a Group III-V compound semiconductor, a first channel control layer on the high-resistance material layer and including a Group III-V compound semiconductor of a first conductivity type, a channel layer on the channel layer control layer and including a nitride semiconductor of a second conductivity type opposite to the first conductivity type, and a gate electrode having a contact of an ohmic contact type with the first channel control layer.

The nitride semiconductor device may further include a second channel control layer including a Group III-V compound semiconductor of the first conductivity type on the channel layer, wherein the first channel control layer, the channel layer and the second channel control layer may have a stack structure, and the gate electrode may surround the stack structure and/or have a contact of an ohmic contact type with at least one of the first channel control layer and the second channel control layer.

At least one of the high-resistance material layer, the first channel control layer, the channel layer, and the second channel control layer may include gallium nitride (GaN).

The high-resistance material layer may include a protrusion, and the stack structure may be on the protrusion of the high-resistance material layer.

The high-resistance material layer may include a plurality of protrusions in a stripe shape, and the stack structure may be on each of the plurality of protrusions of the high-resistance material layer to include a plurality of stack structure arrays.

The first channel control layer adjacent to the high-resistance material layer may include a plurality of protrusions in a stripe shape, and the stack structure may be on each of the plurality of protrusions of the first channel control layer to include a plurality of stack structure arrays.

The stack structure may include a plurality of first channel control layers and a plurality of channel layers by repeatedly stacking the first channel control layer and the channel layer, the plurality of protrusions may be on a first channel control layer closest to the high-resistance material layer among the plurality of first channel control layers, and the second channel control layer may be the uppermost layer of the stack structure.

The gate electrode and the channel layer may have a contact of a Schottky contact type or to provide electrical insulation.

The plurality of channel layers may have same thickness, or at least one channel layer may have a different thickness.

The stack structure may include a plurality of first channel control layers and a plurality of channel layers by repeatedly stacking the first channel control layer and the channel layer, and the second channel control layer may be an uppermost layer of the stack structure.

The gate electrode and the channel layer may have a contact of a Schottky contact type or to provide electrical insulation.

The plurality of channel layers may have same thickness, or at least one channel layer may have a different thickness.

The nitride semiconductor device may further include a source electrode and a drain electrode, the source electrode and the drain electrode having an ohmic contact with the channel layer.

At least one of the high-resistance material layer, the first channel control layer, and the channel layer may include GaN.

The gate electrode and the channel layer may have a contact of a Schottky contact type and/or may have provide electrical insulation.

The first channel control layer and the channel layer may be a stack structure, and the gate electrode may surround the stack structure or provided to form a contact of an ohmic contact type with the first channel control layer.

The high-resistance material layer may include a protrusion, and the stack structure may be on the protrusion of the high-resistance material layer.

The high-resistance material layer may include a plurality of protrusions in a stripe shape, and the stack structure may be on each of the plurality of protrusions of the high-resistance material layer, and may include a plurality of stack structure arrays.

The first channel control layer may include a plurality of protrusions in stripe shape, and the channel layer may be respectively on a plurality of protrusions of the first channel control layer, and may include a plurality of stack structure arrays.

A p-type nitride semiconductor device and an n-type nitride semiconductor device may be monolithically integrated, and any one of the p-type nitride semiconductor device and the n-type nitride semiconductor device may further include a dummy-channel layer between the high-resistance material layer and the first channel control layer.

BRIEF DESCRIPTION OF THE DRAWINGS

The above and other aspects, features, and/or advantages of example embodiments will be more apparent from the following description taken in conjunction with the accompanying drawings, in which.

DETAILED DESCRIPTION OF SOME EXAMPLE EMBODIMENTS

Figure 1:
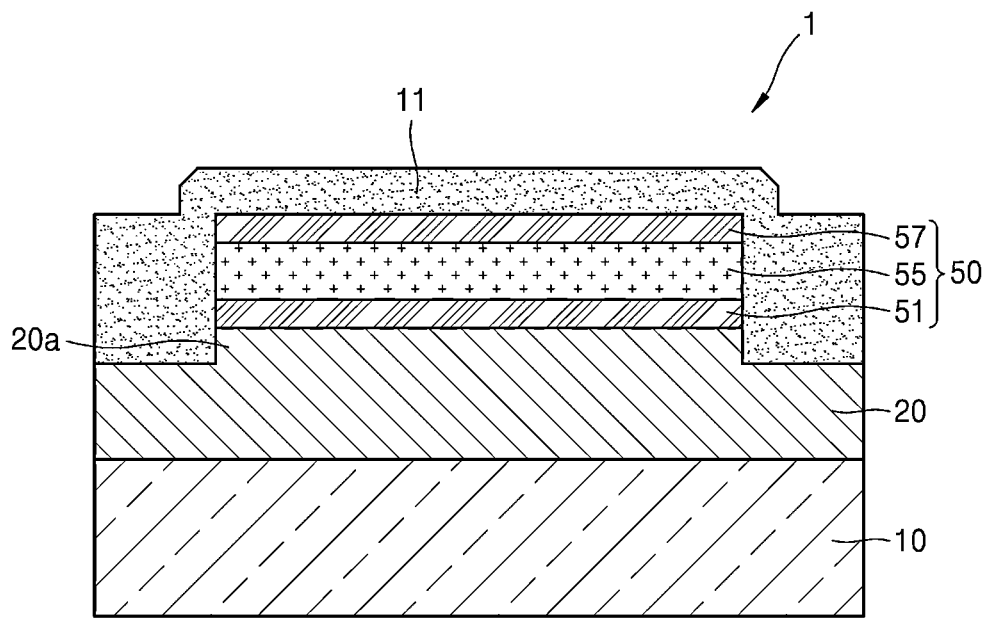
FIG. 1 is a schematic cross-sectional view of a nitride semiconductor device according to some example embodiments.

Reference will now be made in detail to some embodiments, examples of which are illustrated in the accompanying drawings, wherein like reference numerals refer to like elements throughout. In this regard, example embodiments may have different forms and should not be construed as being limited to the descriptions set forth herein. Accordingly, example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, various example embodiments of inventive concepts will be described in detail with reference to the accompanying drawings. In the drawings, like reference numerals refer to the like elements, and sizes of each of the constituent elements may be exaggerated for clarity and convenience. Example embodiments of inventive concepts may be variously modified and may be embodied in many different forms.

When an element is described using an expression "above" or "on", the element may include not only the element being "immediately on/under/left/right in a contact manner" but also being "on/under/left/right in a non-contact manner". Singular expressions include plural expressions unless the context clearly indicates otherwise. When a part "comprises" or "includes" an element in the specification, unless otherwise defined, it is not excluding other elements but may further include other elements.

The term "above" and similar directional terms may be applied to both singular and plural. With respect to operations that constitute a method, the operations may be performed in any appropriate sequence unless the sequence of operations is clearly described or unless the context clearly indicates otherwise. The operations may not necessarily be performed in the order of sequence.

Also, in the specification, the term "units" or " . . . modules" denote units or modules that process at least one function or operation, and may be realized by hardware, software, or a combination of hardware and software.

Connections and/or connection members of lines between components shown in the drawings illustrate functional connections and/or physical or circuit connections, and the connections or connection members can be represented by replaceable or additional various functional connections, physical connections, or circuit connections in an actual apparatus.

The use of all examples or example terms is merely for describing the technical scope of inventive concepts in detail, and thus, the scope of inventive concepts is not limited by the examples or the example terms as long as it is not defined by the claims.

A nitride semiconductor device according to some example embodiments is provided to have a field effect gate. A nitride semiconductor device according to some example embodiments includes a channel control layer including a Group III-V compound semiconductor including/doped with a first conductivity type, a channel layer including a nitride semiconductor including/doped with a second conductivity type opposite to the first conductivity type, and a gate electrode forming a contact corresponding to an ohmic contact with the channel control layer. The nitride semiconductor device may be provided to utilize a field effect of a p-n junction of the channel layer and the channel control layer.

The channel control layer may be located on one side of the channel layer, for example, only on or below the channel layer, or may be located both on a bottom and top of the channel layer, respectively. For example, the nitride semiconductor device according to some example embodiments may be provided to have a stack structure of a channel control layer and a channel layer, or a stack structure of a channel control layer-channel layer-channel control layer. Alternatively or additionally, the nitride semiconductor device may be provided to have a stack structure of a plurality of channels by repeatedly and alternately stacking a channel layer and a channel control layer. Alternatively or additionally, the nitride semiconductor device according to some example embodiments may be provided so that, for example, a stack structure includes only a channel layer.

For example, the nitride semiconductor device according to some example embodiments may have a stack structure for forming a channel including at least one channel control layer and at least one channel layer. At this point, when the stack structure includes a plurality of channel layers and a plurality of channel control layers, a multi-layered channel may be formed by providing a channel control layer on the lowest layer and uppermost layer of the stack structure, respectively. In this way, the current density may be increased by forming a multi-layered channel. Alternatively or additionally, in a nitride semiconductor device according to some example embodiments, a stack structure for forming a channel of a channel control layer and a channel layer may be patterned to form a stack structure array at least in a gate region by an etching process in a direction parallel to the channel in a stripe shape. In this case, the etching pattern may have various shapes, such as a rectangular shape, a circular shape, a rhombus shape, and a trapezoidal shape. The etch region may be limited to the gate region, may include at least a partial drift region including the gate region, or may include the entire drift region, e.g., the entire region excluding source/drain regions. By this etching process, a width of the stripe may be constant or may be formed so that a width in the gate region is less than that of in remaining regions. When a width/transistor width of the channel is reduced in or within the gate region, a normally-off (N-off), e.g., an enhancement mode (E-mode) switch or transistor, may be implemented. Here, the gate region may include a region where a gate electrode is formed to surround the stack structure of the channel control layer and the channel layer. A drift region may correspond to a region where a channel is formed between a source region and a drain region.

In a nitride semiconductor device according to some example embodiments, the first conductivity type may be any one of an n-type (majority electron carriers) or a p-type (majority hole carriers), and the second conductivity type may be the other one. A nitride semiconductor may be, for example, one or more of AlN, GaN, InN, InGaN, AlGaN, AlInN, AlInGaN, and the like. For example, at least one of the channel layer and the channel control layer may include GaN, and one of the channel layer and the channel control layer may be doped with an n-type conductivity type such as at least one of Si, Ge, P, As, or S band the other one may be doped with a p-type conductivity type such as at least one of Mg, B, Al, or Ga. For example, one of the channel layer and the channel control layer may include n-type GaN, and the other one may include p-type GaN.

A nitride semiconductor device according to some example embodiments may be implemented as, for example, a multi-layered device. For example, the nitride semiconductor device according to some example embodiments may be a transistor having a stack structure of a plurality of channel layers and a plurality of channel control layers formed on a high-resistance material layer, for example, a high-resistance GaN layer, wherein the channel control layer may include a Group III-V compound semiconductor material, for example, GaN, and the channel layer may include a nitride semiconductor material, for example, GaN. The nitride semiconductor device according to some example embodiments may include a gate region, a source region, a drain region, and a drift region. The channel control layer and the channel layer may be alternately grown/deposited with opposite doping impurities to each other incorporated therein. The gate region may be etched in a stripe shape in a direction parallel to a channel, and the etching pattern may have various shapes, such as at least one of a rectangular shape, a circular shape, a rhombus shape, and a trapezoidal shape. The etch region may be limited to the gate region, may include the gate region and a partial drift region, or may include the entire region excluding source/drain regions. The uppermost channel control layer in the source/drain regions may also be etched. The stack structure of the gate region may be recessed to a channel control layer on a high-resistance material layer or recessed to the high-resistance material layer. Alternatively or additionally, a gate electrode may be formed in all or part of the recessed region. The gate electrode may be formed to form, for example, a contact of an ohmic contact type (e.g., having a current-voltage (I-V) curve that is linear through the origin) with a low contact resistance with a channel control layer. The gate electrode may be formed to from a Schottky contact with a high contact resistance with the channel layer (e.g., having a non-linear I-V curve through the origin), or to be electrically insulated from the channel layer by using a dielectric material. The source electrode and the drain electrode may be formed to have an ohmic contact (e.g. to be linear through the origin) with the channel layer, and to form a Schottky contact with the channel control layer (e.g. to be non-linear through the origin), or to be electrically insulated from the channel control layer by including a dielectric material.

The nitride semiconductor device according to some example embodiments may be implemented as, for example, a three-layer type (a p-n-p type or an n-p-n type) device. For example, the nitride semiconductor device according to some example embodiments is/includes a transistor having a stack structure of three layers (a first channel control layer, a channel layer, and a second channel control layer) on a high-resistance material layer, for example, a high-resistance GaN layer, wherein the first and second channel control layers may include a Group III-V compound semiconductor material, for example, GaN, and the channel layer may include a nitride semiconductor material, for example, GaN. The nitride semiconductor device according to some example embodiments may include a gate region, a source region, a drain region, and a drift region. The first and second channel control layers and the channel layer may be alternately grown/deposited with opposite doping impurities to each other. The gate region may be etched in a stripe shape in a direction parallel to a channel, and the etching pattern may have various shapes, such as a rectangular shape, a circular shape, a rhombus shape, and a trapezoidal shape. The etch region may be limited to the gate region, may include the gate region and a partial drift region, or may include the entire region excluding source/drain regions. The uppermost second channel control layer in the source/drain regions may also be etched. The stack structure of the gate region may be recessed to the first channel control layer on the high-resistance material layer or recessed to the high-resistance material layer. The channel layer and the gate electrode may be electrically separated by forming an insulator on etched sidewalls. The gate electrode may be formed in all or part of the recessed region. The gate electrode may be formed to form, for example, a contact of an ohmic contact type with a low contact resistance with first and second channel control layers, to from a Schottky contact with a high contact resistance with the channel layer, or to be electrically insulated from the channel layer by using a dielectric material. The source electrode and the drain electrode may be formed to have an ohmic contact with the channel layer, and to have a Schottky contact with the first and second channel control layers, and/or to be electrically insulated from the first and second channel layers by using a dielectric material.

The nitride semiconductor device according to some example embodiments may be implemented as, for example, a two-layer type (an n-p-type or a p-n-type) device. For example, the nitride semiconductor device according to some example embodiments is a transistor having a stack structure of two layers (a channel layer and a channel control layer) on a high-resistance material layer, for example, a high-resistance GaN layer, and may include a lower channel layer and an upper channel control layer or a lower channel control layer and an upper channel layer, wherein the channel layer may include a nitride semiconductor material, for example, GaN, and the channel control layer may include a Group III-V compound semiconductor material, for example, GaN. The nitride semiconductor device according to some example embodiments may include a gate region, a source region, a drain region, and a drift region. The channel layer and the channel control layer may be alternately grown/deposited with opposite doping impurities to each other. The gate region may be etched in a stripe shape in a direction parallel to a channel, and the etching pattern may have various shapes, such as at least one of a rectangular shape, a circular shape, a rhombus shape, and a trapezoidal shape. The etch region may be limited to the gate region, may include the gate region and a partial drift region, or may include the entire region excluding source/drain regions. The channel control layer in the source/drain regions may also be etched. The stack structure of the gate region may be recessed to the high-resistance material layer. The gate electrode may be formed in all or part of the recessed region. The gate electrode may be formed to have, for example, a contact of an ohmic contact type with a low contact resistance with a channel control layer, to have a Schottky contact with a high contact resistance with the channel layer, or to be electrically insulated from the channel layer by including a dielectric material. The source electrode and the drain electrode may be formed to form an ohmic contact with the channel layer.

The nitride semiconductor device according to some example embodiments may be implemented as, for example, a one-layer type (an n-type or a p-type) device. For example, the nitride semiconductor device according to some example embodiments may be a transistor having only one channel layer on a high-resistance material layer, for example, a high-resistance GaN layer, wherein the channel layer may include a nitride semiconductor material, for example, GaN. The nitride semiconductor device according to some example embodiments may include a gate region, a source region, a drain region, and a drift region. The gate region may be etched in a stripe shape in a direction parallel to a channel, and the etching pattern may have various shapes, such as at least one of a rectangular shape, a circular shape, a rhombus shape, and a trapezoidal shape. The etch region may be limited to the gate region, may include the gate region and a partial drift region, or may include the entire region excluding source/drain regions. The gate electrode may be formed in all or part of the recessed region. The gate electrode may be formed to have a high contact resistance, for example, to form a Schottky contact. The source electrode and the drain electrode may be formed to have an ohmic contact with the channel layer. A high-concentration Group III-V compound semiconductor material layer, for example, a high-concentration GaN layer may be additionally formed in the source region, the drain region, and the drift region.

The nitride semiconductor device according to some example embodiments may be implemented as a device simultaneously including, for example, an n-type and a p-type. For example, the nitride semiconductor device according to some example embodiments is a transistor having a stack structure of a plurality of layers on a high-resistance material layer, for example, a high-resistance GaN layer, wherein the stack structure includes a channel control layer and a channel layer, and at this point, the channel control layer may include a Group III-V compound semiconductor material, for example, GaN, and the channel layer may include a nitride semiconductor material, for example, GaN. The nitride semiconductor device according to some example embodiments may include a plurality of gate regions, source regions, drain regions, and drift regions, for example, two gate regions, two source regions, two drain regions, and two drift regions. For example, the first channel control layer and the first channel layer may be alternately grown/deposited with opposite dopings/impurities to each other to form a first transistor, and the second channel control layer and the second channel layer may have dopings/impurities opposite to that of the first channel control layer and the first channel layer to form a second transistor on the first channel control layer. The second channel control layer and the second channel layer in a first transistor formation region may be removed. A gate region of each of the first and second transistors may be etched in a stripe shape in a direction parallel to a channel, and the etching pattern may have various shapes, such as at least one of a rectangular shape, a circular shape, a rhombus shape, and a trapezoidal shape. The etch region may be limited to the gate region, may include the gate region and a partial drift region, or may include the entire region excluding source/drain regions. The uppermost second channel control layer in the source/drain regions may also be etched. The stack structure of the gate region of the first transistor may be recessed up to the first channel control layer on a high-resistance material layer or recessed to the high-resistance material layer. The stack structure of the gate region of the second transistor may be recessed up to an upper surface of the first channel control layer on the high-resistance material layer. The gate electrode may be formed in all or part of the recessed region. The gate electrode may be formed to have, for example, a contact of an ohmic contact type with a low contact resistance with first and second channel control layers, to have a Schottky contact with a high contact resistance with the channel layer, or to be electrically insulated from the first and second channel layers by using a dielectric material. The source electrode and the drain electrode may be formed to have an ohmic contact with the first and second channel layers, to have a Schottky contact with the first and second channel control layers, or to be electrically insulated from the first and second channel control layers by using a dielectric material.

The nitride semiconductor device according to some example embodiments may have a depletion region formed by a p-n junction by doping the channel control layer to a first conductivity type and the channel layer to a second conductivity type. In the nitride semiconductor device according to some example embodiments, the depletion region of the channel layer may be controlled according to a gate voltage, and as a result, a channel may be turned on or off.

In the nitride semiconductor device according to some example embodiments, a threshold voltage for turning the channel layer on and off may be controlled according to a thickness and/or a doping concentration of an impurity of the second conductivity type of the channel layer. The nitride semiconductor device according to some example embodiments may have a normally-on characteristic (e.g. may be a depletion-mode switch) wherein a current flows between a drain electrode and a source electrode when a gate voltage is 0V. In this case, a current flow between the drain electrode and the source electrode may be turned off by applying a negative voltage equal to or greater than a threshold voltage to the gate electrode. In the nitride semiconductor device according to some example embodiments, a channel layer may be formed to have a thickness by which a channel is depleted when a negative voltage less than a threshold voltage is applied to the channel control layer.

Alternatively or additionally, the nitride semiconductor device according to some example embodiments, when a gate voltage is 0V, may have a normally-off characteristic, wherein a current flow between the drain electrode and the source electrode is blocked due to controlling a thickness and/or a doping concentration of an impurity of the second conductivity type of the channel layer. In addition, the nitride semiconductor device according to some example embodiments may have a normally-off (enhancement) mode by reducing a width of a channel in a gate region.

In the nitride semiconductor device according to some example embodiments, a threshold voltage may be determined by a thickness and/or a doping concentration of an impurity to the second conductivity type of the channel layer, and may also be determined by a thickness and a doping concentration of an impurity to the first conductivity type of the channel control layer. Alternatively or additionally, in the nitride semiconductor device according to some example embodiments, the threshold voltage may also be determined by a contact area between a channel control layer and a gate electrode.

Figure 2:
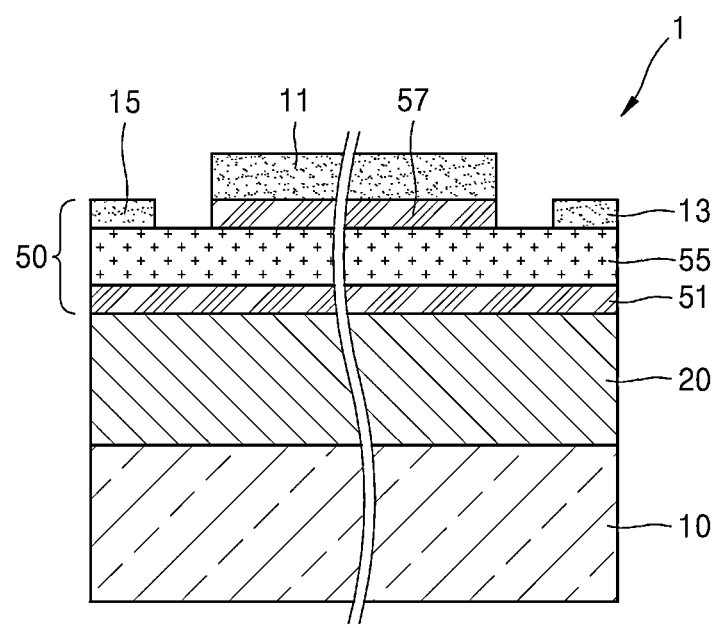
FIG. 2 is a side view of the nitride semiconductor device of FIG. 1.

FIG. 1 is a schematic cross-sectional view showing a nitride semiconductor device 1 according to some example embodiments. FIG. 2 is a side view of the nitride semiconductor device 1 of FIG. 1.

Referring to FIGS. 1 and 2, the nitride semiconductor device 1 according to some example embodiments includes a high-resistance material layer 20 on a substrate 10, a first channel control layer 51 on the high-resistance material layer 20, a channel layer 55 on the first channel control layer 51, and a gate electrode 11 provided to form a contact of an ohmic contact type with the first channel control layer 51. The nitride semiconductor device 1 according to some example embodiments may further include a second channel control layer 57 on the channel layer 55. In addition, the nitride semiconductor device 1 according to some example embodiments may include a source electrode 13 and a drain electrode 15 that are separated from the gate electrode 11 on the channel layer 55 and are provided to form a contact of an ohmic contact type with the channel layer 55. In FIG. 2, an electrode positioned on the right may be the source electrode 13 and an electrode positioned on the left may be the drain electrode 15, but example embodiments are not limited thereto. For example, the electrode positioned on the right may be the drain electrode 15, and the electrode positioned on the left may be the source electrode 13.

According to the nitride semiconductor device 1 according to some example embodiments, the first channel control layer 51 and the channel layer 55 may form a stack structure 50. In addition, when the second channel control layer 57 is further included in the nitride semiconductor device 1, the first channel control layer 51, the channel layer 55, and the second channel control layer 57 may form a stack structure 50. In some example embodiments and various example embodiments below, the contact of the ohmic contact type may be an ohmic contact and/or a contact similar to the ohmic contact.

In the nitride semiconductor device 1 according to some example embodiments, the channel layer 55 and the first channel control layer 51 may be doped with opposite conductivity types to each other to form a depletion region having a p-n junction. In addition, when the second channel control layer 57 is further included in the nitride semiconductor device 1, the channel layer 55 and the second channel control layer 57 may be doped with opposite conductivity types to each other to form a depletion region having a p-n junction.

For example, the first channel control layer 51 may be doped with a first conductivity type (e.g. at least one of Mg, B, Al, or Ga), ad the channel layer 55 may be doped with a second conductivity type opposite to the first conductivity type (e.g. at least one of Si, Ge, P, As, or Sb). Also, for example, the second channel control layer 57 may be doped with the first conductivity type (e.g. at least one of Mg, B, Al, or Ga). When the first conductivity type is an n-type, the second conductivity type may be a p-type. Also, when the first conductivity type is a p-type, the second conductivity type may be an n-type.

For example, when the nitride semiconductor device 1 according to some example embodiments includes the stack structure 50 of the first channel control layer 51-the channel layer 55-the second channel control layer 57, the stack structure 50 may have a p-n-p structure or an n-p-n structure.

The nitride semiconductor device 1 according to some example embodiments may utilize the field effect of a p-n junction, and the depletion region of the channel layer 55 may be controlled according to a gate voltage to turn a channel on and off.

The substrate 10 may include, for example, at least one of sapphire, silicon (Si), silicon carbide (SiC), gallium nitride (GaN), and/or the like. However, this is only an example, and the substrate 10 may include various other materials.

A buffer layer (not shown) or the like may further be included between the substrate 10 and the high-resistance material layer 20. For example, the buffer layer may further be included on the substrate 10. In addition, a nucleation layer (not shown) may further be included for growth of the buffer layer between the substrate 10 and the buffer layer. The buffer layer may alleviate a difference in lattice constant and thermal expansion coefficient between semiconductor material layers of the nitride semiconductor device 1, for example, the high-resistance material layer 20, at least one of the first and second channel control layers 51 and 57, and the channel layers 55, may include a Group III-V compound semiconductor material, and may have a single-layer or multi-layer structure. The buffer layer may include, for example, a nitride including at least one of Al, Ga, In, and B, and may have a single-layer or multi-layer structure. The buffer layer may include, for example, $Al_xIn_yGa_{1-x-y}N$ ($0 \le x \le 1$, $0 \le y \le 1$, $x+y \le 1$). The buffer layer may include, for example, at least one of AlN, GaN, AlGaN, InGaN, AlInN, and AlGaInN, and may have a single-layer or multi-layer structure.

The high-resistance material layer 20 may include a low-conductivity material to provide electrical insulation between the substrate 10 and the structure of the nitride semiconductor device 1 formed thereon. Alternatively or additionally, the high-resistance material layer 20 may include a Group III-V compound semiconductor material to help mitigate a lattice constant difference between the substrate 10 and the stack structure 50 or to help maintain lattice matching with the stack structure 50. For example, the high-resistance material layer 20 may include a Group III-V compound semiconductor material to provide electrical insulation with the first channel control layer 51 while lattice matching is possible therewith. The high-resistance material layer 20 may include, for example, the same base material as the first channel control layer 51, and may be formed in an undoped state. When the first channel control layer 51 or the like includes a Group III-V compound semiconductor material as a base material, the high-resistance material layer 20 may be an undoped Group III-V compound semiconductor material layer. For example, when the first channel control layer 51 or the like includes GaN as a base material, the high-resistance material layer 20 may be an undoped GaN layer.

Figure 4:
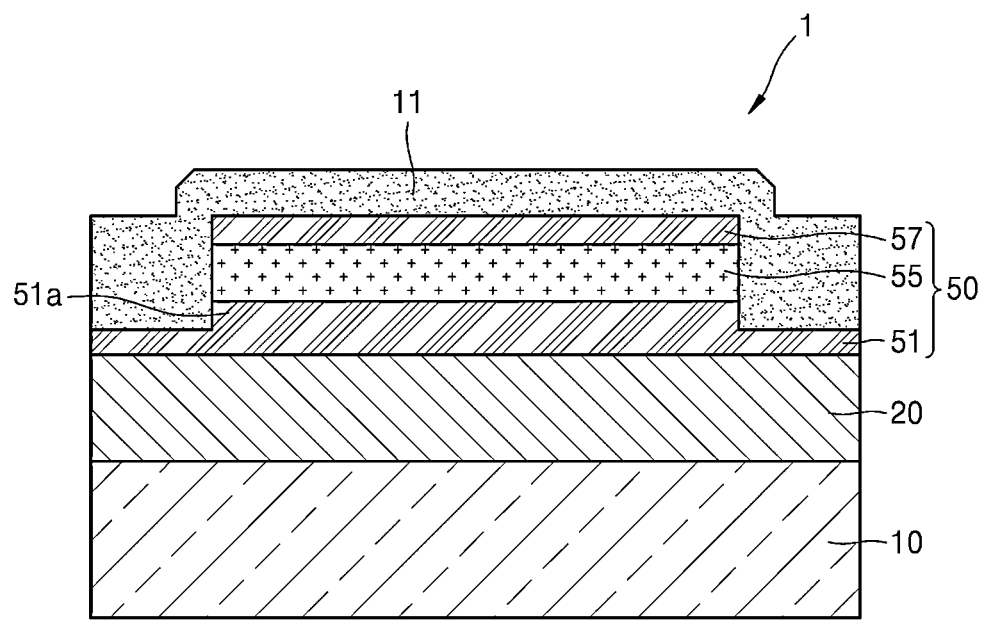
FIG. 4 is a schematic cross-sectional view of a nitride semiconductor device according to some example embodiments.

The high-resistance material layer 20 may be patterned so that only a portion where the stack structure 50 is to be formed has a protrusion 20a, and the stack structure 50 may be formed on the protrusion 20a of the high-resistance material layer 20. Accordingly, instead of forming the high-resistance material layer 20 to have the protrusion 20a, as shown in FIG. 4 which will be described later, the first channel control layer 51 formed adjacent to the high-resistance material layer 20 is patterned to protrude only a region corresponding to the stack structure 50, and the stack structure 50 including the channel layer 55 may be formed on the protrusion 51a of the first channel control layer 51.

The first channel control layer 51 is provided on the high-resistance material layer 20, includes a Group III-V compound semiconductor material, and may be doped with a first conductivity type. For example, the first channel control layer 51 may include at least one of AlN, GaN, InN, InGaN, AlGaN, AlInN, AlInGaN, and the like, and may be doped with the first conductivity type. For example, the first channel control layer 51 may be a p-type GaN layer. As another example, the first channel control layer 51 may be an n-type GaN layer.

The channel layer 55 is provided on the first channel control layer 51 and includes a nitride semiconductor, and may be doped with a second conductivity type opposite to the first conductivity type. For example, the channel layer 55 may include at least one of AlN, GaN, InN, InGaN, AlGaN, AlInN, AlInGaN, and the like, and may be doped with the second conductivity type. For example, the channel layer 55 may be an n-type GaN layer. As another example, the channel layer 55 may be a p-type GaN layer. For example, when the first channel control layer 51 is a p-type GaN layer, the channel layer 55 may be an n-type GaN layer. Also, for example, when the first channel control layer 51 is an n-type GaN layer, the channel layer 55 may be a p-type GaN layer.

In this way, when the first channel control layer 51 is a p-type channel control layer, the channel layer 55 may be an n-type channel layer. Also, when the first channel control layer 51 is an n-type, the channel layer 55 may be a p-type.

The second channel control layer 57 may be formed on the channel layer 55 to be positioned on the uppermost layer of the stack structure 50, may include a Group III-V compound semiconductor material, and may be doped with a conductivity type opposite to that of the channel layer 55, that is, the first conductivity type. For example, the second channel control layer 57 may include at least one of AlN, GaN, InN, InGaN, AlGaN, AlInN, AlInGaN, and the like, and may be doped with the first conductivity type. The second channel control layer 57 may include the same Group III-V compound semiconductor material as the first channel control layer 51, and may be doped with the same conductivity type.

For example, the second channel control layer 57 may be a p-type GaN layer as the first channel control layer 51. As another example, the second channel control layer 57 may be an n-type GaN layer as the first channel control layer 51. For example, when the channel layer 55 is an n-type GaN layer, not only the first channel control layer 51 but also the second channel control layer 57 may be a p-type GaN layer. Also, for example, when the channel layer 55 is a p-type GaN layer, not only the first channel control layer 51 but also the second channel control layer 57 may be an n-type GaN layer.

As such, when the stack structure 50 includes the first channel control layer 51, the channel layer 55, and the second channel control layer 57, the first channel control layer 51 may be a p-type, the channel layer 55 may be an n-type, and the second channel control layer 57 may be a p-type. In addition, when the stack structure 50 includes the first channel control layer 51, the channel layer 55, and the second channel control layer 57, the first channel control layer 51 may be an n-type, the channel layer 55 may be a p-type, and the second channel control layer 57 may be an n-type.

The gate electrode 11 may be provided to form a contact of an ohmic contact type with the first channel control layer 51, e.g. on a sidewall of the first channel control layer 51 and/or on a top of the control layer 51. Also, when the nitride semiconductor device further includes the second channel control layer 57, the gate electrode 11 may be provided to form a contact of an ohmic contact type with the first channel control layer 51 and the second channel control layer 57, e.g. on a sidewall of the first channel control layer 51 and a top and sidewall of the second channel control layer 57. As another example, the gate electrode 11 may be provided to form a contact of an ohmic contact type with at least one of the first channel control layer 51 and the second channel control layer 57. The gate electrode 11 may be provided to form a Schottky contact with the channel layer 55, e.g. on a sidewall of the channel layer 51. As another example, an insulating layer may be formed to electrically insulate between the gate electrode 11 and the channel layer 55.

The gate electrode 11 may be formed to surround the stack structure 50 in a gate region.

For example, in a state that, as shown in FIG. 1, the stack structure 50 is formed on the protrusion 20a of the high-resistance material layer 20. As shown in FIG. 4, the stack structure 50 including the channel layer 55 is formed on the protrusion 51a of the first channel control layer 51 formed adjacent to the high-resistance material layer 20, the gate electrode 11 may be formed to surround the stack structure 50. Accordingly, the nitride semiconductor device 1 according to some example embodiments may be formed in a fin-like structure in a horizontal direction.

At this point, because a contact of an ohmic contact type is formed between the gate electrode 11 and at least one of the first channel control layer 51 and the second channel control layer 57, while a Schottky contact or electrical insulation is formed between the gate electrode 11 and the channel layer 55, an energy barrier, that is, a depletion region is formed at a contact portion between the gate electrode 11 and the channel layer 55.

In addition, because a p-n junction is formed between the first channel control layer 51 and the channel layer 55 and between the second channel control layer 57 and the channel layer 55, a depletion region is formed.

Figure 3A:
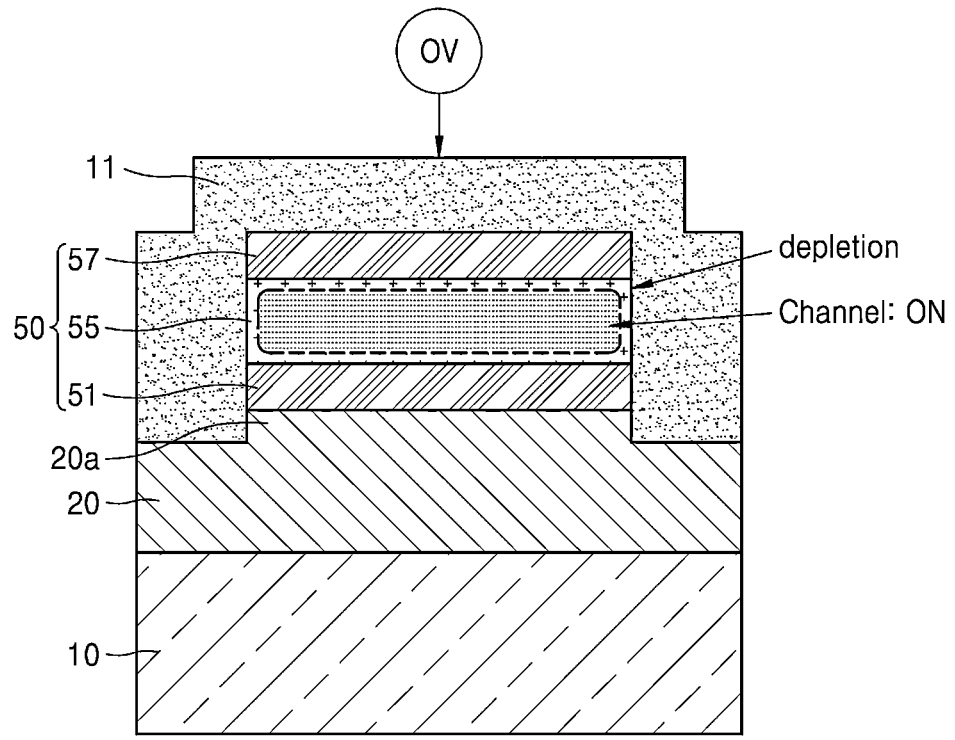
FIG. 3A shows a state in which a nitride semiconductor device according to the embodiment operates in a channel-on state when no gate voltage is applied thereto (e.g. when gate voltage=0V)

Accordingly, when gate voltage is not applied (gate voltage=0V) to the nitride semiconductor device 1 according to some example embodiments, for example, as shown in FIG. 3A, a depletion region is formed around the channel layer 55, and thus, the nitride semiconductor device 1 may be in a channel-on state wherein carriers move through the center of the channel layer 55. That is, for example, when a gate voltage is not applied (gate voltage=0V), the nitride semiconductor device 1 according to some example embodiments may have a normally-on characteristic wherein a current flows between the drain electrode 15 and the source electrode 13. As such, when no gate voltage is applied (gate voltage=0V), the nitride semiconductor device 1 according to the embodiment may be implemented as a D (depletion)-mode device in which a channel is turned on. Here, according to a thickness of a channel, the nitride semiconductor device 1 according to some example embodiments may be implemented as an enhancement mode device.

Figure 3B:
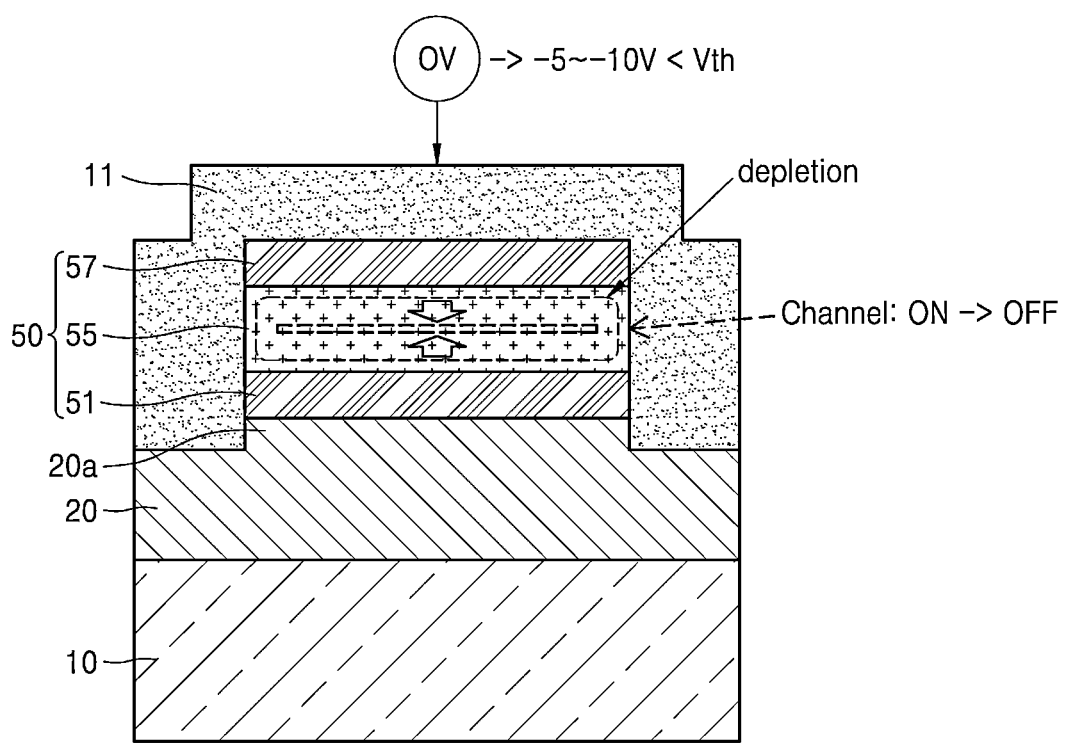
FIG. 3B shows a state in which a nitride semiconductor device according to some example embodiments operates in a switch-off state when carriers in a channel are depleted when the semiconductor device is driven with a negative voltage.

Referring to FIG. 3B, when the nitride semiconductor device 1 according to some example embodiments is driven with, for example, a negative voltage, a depletion region between the first channel control layer 51 and the channel layer 55 and between the second channel control layer 57 and the channel layer 55 is widened to deplete carriers in the channel, and as a result, a switch may be turned off. When the channel layer 55 is an n-type, in the nitride semiconductor device 1 according to some example embodiments, for example, when a voltage less than a threshold voltage Vth is applied to the gate electrode 11, a bias is applied to a reverse direction to p-n junction of the n-type channel layer 55, and thus, the channel may be turned off. FIG. 3B shows an example of turning off the channel (Channel: ON→OFF) when a gate voltage of −5V to −10V, which is less than a threshold voltage Vth, is applied to the nitride semiconductor device 1, but the present embodiment is not limited thereto, and the range of the gate voltage capable of turning off the channel may vary.

Referring to FIG. 2, the source electrode 13 and the drain electrode 15 may be formed on the channel layer 55 to be separated from each other. The source electrode 13 and the drain electrode 15 may be formed to form an ohmic contact with the channel layer 55. The channel layer 55 may be used as a current path, i.e., a channel between the source electrode 13 and the drain electrode 15.

Accordingly, when the nitride semiconductor device 1 according to some example embodiments is provided to have, for example, a normally-on characteristic, and when a gate voltage is not applied (gate voltage=0V) to the nitride semiconductor device 1, as shown in FIG. 3A, because a depletion region is formed around the channel layer 55, and a central part of the channel layer 55 is used as a current path, that is, a channel, and as a result, the nitride semiconductor device 1 may be in a channel-on state. In this case, when a gate voltage less than a threshold voltage Vth is applied to the nitride semiconductor device 1 according to some example embodiments, the depletion region of the channel layer 55 is widened to deplete carriers in the channel, and as a result, a current path between the source electrode 13 and the drain electrode 15, that is, a channel is blocked, and the switch may be turned off.

In this way, the nitride semiconductor device 1 according to some example embodiments may have a normally-on characteristic, and the channel may be turned on/off depending on whether a gate voltage is applied or not, and thus, the nitride semiconductor device 1 may be used as a switching device. As another example, the nitride semiconductor device 1 according to some example embodiments may have a normally-off characteristic, and even in this case, the channel may be turned on/off depending on whether a gate voltage is applied or not, and thus, the nitride semiconductor device 1 may be used as a switching device.

As described above, in the nitride semiconductor device 1 according to some example embodiments, instead of forming the high-resistance material layer 20 to have the protrusion 20a, as shown in FIG. 4, the first channel control layer 51 formed adjacent to the high-resistance material layer 20 is patterned so that only a region corresponding to the stack structure 50 is protruded, and then, the stack structure 50 may be formed on a protrusion 51a of the first channel control layer 51.

When the nitride semiconductor device 1 of FIG. 4 is compared with the nitride semiconductor device 1 of FIG. 1, a difference may be that, instead of forming the high-resistance material layer 20 to have the protrusion 20a, the first channel control layer 51 formed adjacent to the high-resistance material layer 20 is patterned to protrude only a region corresponding to the stack structure 50 and the stack structure 50 is formed on the protrusion 51a of the first channel control layer 51.

In the nitride semiconductor device 1 according to some example embodiments described with reference to FIGS. 1 and 4, the stack structure 50 may be formed as a multi-layer structure including repeatedly stacked the first channel control layer 51 and the channel layer 55 and the second channel control layer 57 as an uppermost layer. For example, the stack structure 50 may include a plurality of first channel control layers 51, a plurality of channel layers 55, and the second channel control layer 57 as the uppermost layer. As described above, a plurality of channels may be formed by the plurality of channel layers 55 by alternately and repeatedly stacking the first channel control layer 51 and the channel layer 55.

According to the nitride semiconductor device 1 according to some example embodiments, the thickness of the channel layer 55 may be controlled through epitaxy, and the stack structure 50 may be formed in a fin-like structure in a horizontal direction by forming the stack structure 50 to surround the gate electrode 11. Thus, the process difficulty may be reduced and/or a channel region may be increased, thereby increasing the current density.

In addition, according to the nitride semiconductor device 1 according to some example embodiments and the nitride semiconductor device according to various example embodiments to be described later, because a field effect of a p-n junction between the channel layer 55 and the first channel control layer 51 and between the channel layer 55 and the second channel control layer 57 is used, when a fin-like stack structure 50 is formed, the size of a pattern may be increased compared to an existing fin-like stack structure. Thus, the process difficulty may be reduced.

As will be described below, in the nitride semiconductor device 1 according to some example embodiments, the stack structure 50 may be formed to have a stack structure array 50a by patterning the stack structure 50 in a stripe shape in a direction parallel to a channel by using an etching process. In this case, the etching pattern may have various shapes, such as at least one of rectangular shape, a circular shape, a rhombus shape, and a trapezoidal shape. An etch region in which the stripe-shape stack structure array 50a is formed may be limited to the gate region, limited to a partial drift region including the gate region, or may include the entire drift region, e.g., the entire region excluding source/drain regions. In this case, a width of the stripe may be constant or may be formed such that at least a width of the gate region is less than that of remaining portions. When a width of the channel is reduced in the gate region, a normally off (enhancement) mode may be implemented. Here, the gate region may include a region where the gate electrode 11 is formed to surround the stack structure 50 of the channel control layer 57 and the channel layer 55. The drift region may correspond to a region where a channel between a source region and a drain region is formed.

Hereinafter, the nitride semiconductor device 1 according to various embodiments having a stack structure array by patterning a gate region in a stripe shape in a direction parallel to a channel will be described.

Figure 5:
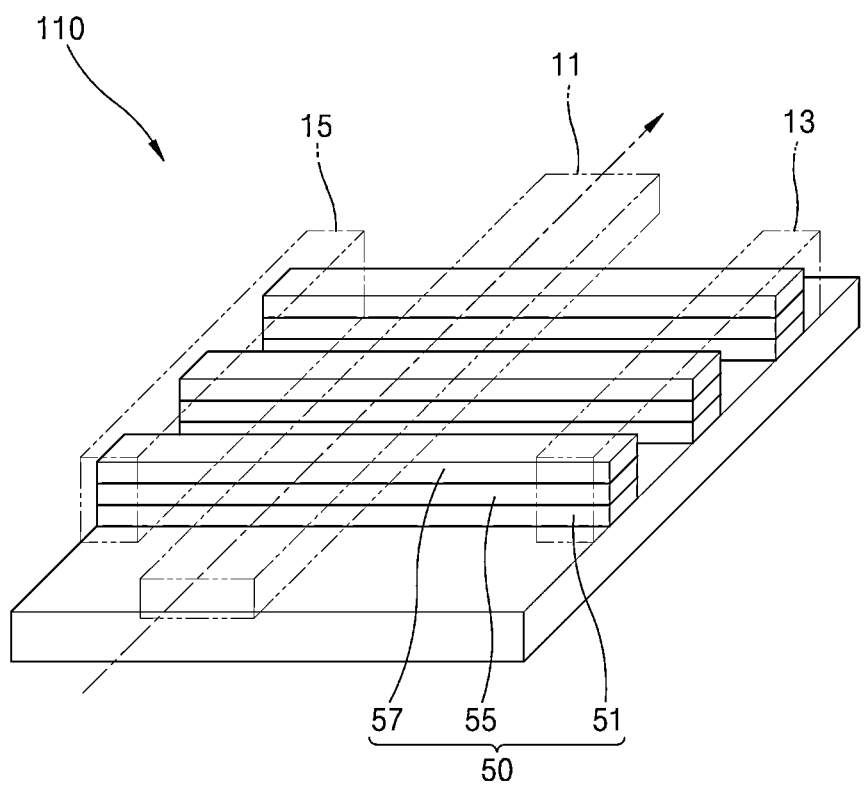
FIGS. 5 and 6 are diagrams schematically showing an example of a stack structure patterned to form a stack structure array in an entire channel region (a drift region) in nitride semiconductor devices according to some example embodiments.
Figure 6:
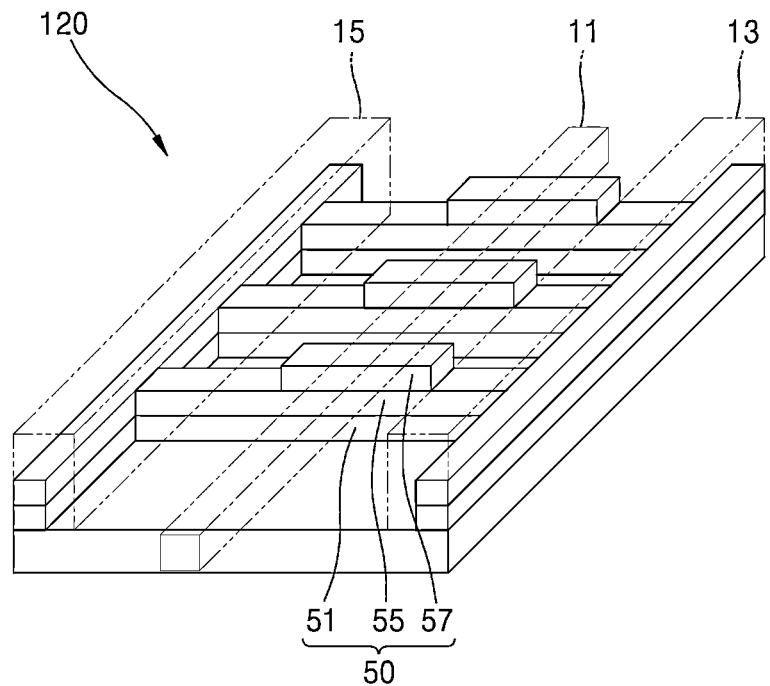

FIGS. 5 and 6 are diagrams schematically showing an example of a stack structure 50 patterned to form a stack structure array 50a in an entire channel region (a drift region) of nitride semiconductor devices 110 and 120 according to another embodiment. FIG. 5 shows an example of the stack structure 50 patterned to regions where the source electrode 13 and the drain electrode 15 are formed.

FIG. 6 shows an example of patterning the nitride semiconductor device 120 in which the uppermost second channel control layer 57 of the stack structure 50 is removed in a region other than a gate region, and, in the regions where the source electrode 13 and the drain electrode 15 are formed, parts of the channel layer 55 and the first channel control layer 51 under the channel layer 55 remain so that the stack structure arrays 50a are connected to each other through the channel layer 55. In FIGS. 5 and 6, it is simply depicted that the gate electrode 11 is positioned on the stack structure 50. However, as it may be seen through cross-sectional views illustrating the embodiments described above and embodiments to be described below, the gate electrode 11 may be formed to surround the stack structure array 50a, and may be provided to form a contact of an ohmic contact type with the channel control layers 51 and 57 of the stack structure 50.

Referring to FIGS. 5 and 6, the stack structure 50 of the nitride semiconductor devices 110 and 120 according to some example embodiments may have, for example, a structure in which a Group III-V compound semiconductor layer of a first conductivity type and a nitride semiconductor layer of a second conductivity type are alternately stacked, a stack structure array 50a is formed by patterning the stack structure 50 in a stripe shape, a gate electrode 11 is formed to surround the stack structure array 50a having a stripe-shape, and a source electrode 13 and a drain electrode 15 are formed to form an ohmic contact with the channel layer 55 at both ends of the stack structure array 50a.

FIGS. 5 and 6 show an example in which the stack structure 50 of the nitride semiconductor devices 110 and 120 according to another embodiment includes the first channel control layer 51, the channel layer 55, and the second channel control layer 57. In a structure including the second channel control layer 57 on the uppermost layer of the stack structure 50, as shown in FIG. 6, the second channel control layer 57 may be removed at least in regions where the source electrode 13 and the drain electrode 15 are formed.

In FIGS. 5 and 6, the stack structure 50 of the nitride semiconductor devices 110 and 120 according to some example embodiments has a stack structure of the first channel control layer 51, the channel layer 55, and the second channel control layer 57; however, example embodiments are not limited thereto. For example, in some example embodiments to be described later, the stack structure 50 may have a structure including repeatedly stacked the first channel control layer 51 and the channel layer 55 and including the second channel control layer 57 as the uppermost layer. In addition, as in some example embodiments to be described below, the stack structure 50 may have a structure including only the first channel control layer 51 and the channel layer 55.

Figure 7:
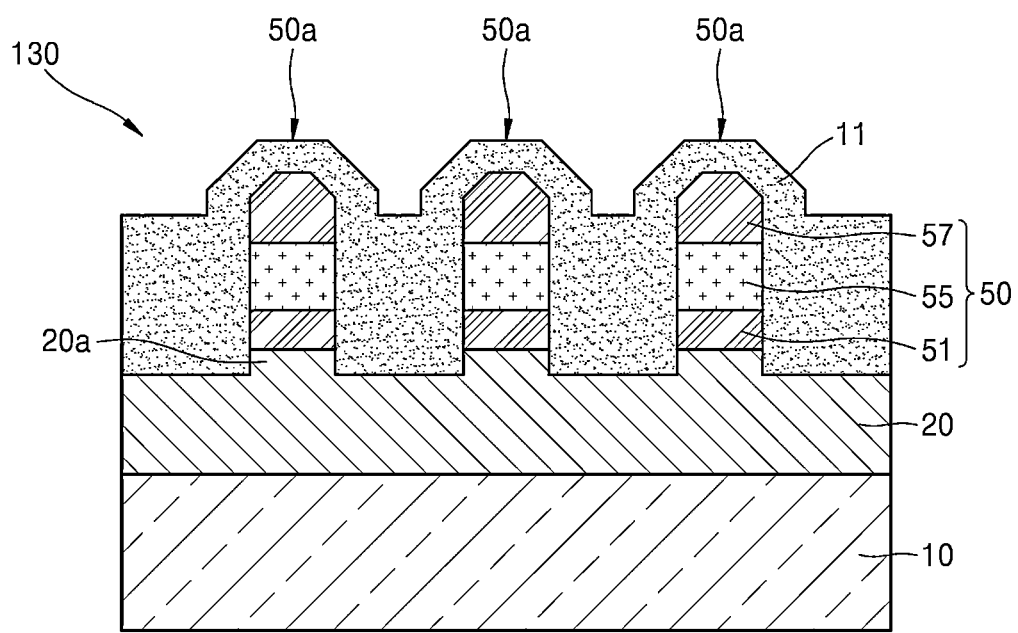
FIGS. 7 to 12, 13A, 13B, and 14 are cross-sectional views illustrating nitride semiconductor devices according to some example embodiments.

FIG. 7 is a cross-sectional view showing a nitride semiconductor device 130 according to another embodiment. In the nitride semiconductor device 130 of FIG. 7, compared with the nitride semiconductor device 1 of FIG. 1, there is a difference in that the high-resistance material layer 20 is patterned to have a plurality of stripe-shaped protrusions 20a on an upper surface thereof, and the stack structure 50 is formed on each protrusion 20a of the high-resistance material layer 20 to form a stack structure array 50a. As described above, the nitride semiconductor device 130 according to another embodiment may be formed in a structure in which a plurality of fin-like stack structures 50 are arranged in an array. In this case, the gate electrode 11 is formed to surround the plurality of fin-like stack structures 50, that is, the stack structure array 50a, and the source electrode 13 and the drain electrode 15 each may be formed to form an ohmic contact with the channel layer 55 of each stack structure 50. The gate electrode 11 may form a contact of an ohmic contact type with the first channel control layer 51 and the second channel control layer 57 of the stack structure array 50a, and may form a Schottky contact with the channel layer 55.

Figure 8:
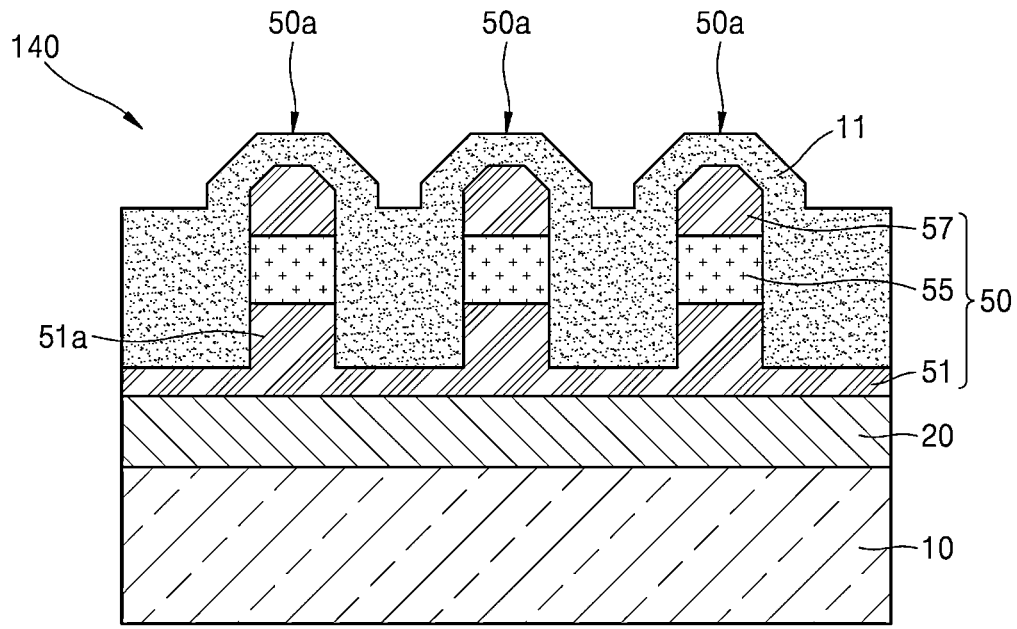

FIG. 8 is a cross-sectional view showing a nitride semiconductor device 140 according to another embodiment. Compared with the nitride semiconductor device 130 of FIG. 7, there is a difference in that the first channel control layer 51 on the high-resistance material layer 20 is patterned to have a plurality of protrusions 51a in the form of a stripe on an upper surface thereof, and the stack structure 50 is formed respectively on the plurality of protrusions 51a of the first channel control layer 51 to form the stack structure array 50a. In this way, the nitride semiconductor device 140 according to some example embodiments may be formed in a structure in which a plurality of fin-like stack structures 50 arranged in an array may be formed by forming a plurality of stripe-shaped protrusions 51a to the first channel control layer 51 adjacent to the high-resistance material layer 20 not on the high-resistance material layer 20. At this point, the gate electrode 11 may form a contact of an ohmic contact type with regions between the protrusions 51a of the first channel control layer 51 while surrounding the plurality of fin-like stack structures 50. That is, the gate electrode 11 may form a contact of an ohmic contact type with regions between the first channel control layer 51, the second channel control layer 57, and the protrusion 51a of the first channel control layer 51 of the fin-like stack structure 50, and may form a Schottky contact with the channel layer 55. The source electrode 13 and the drain electrode 15 may be formed to form an ohmic contact with the channel layer 55 of the stack structure 50.

Figure 9:
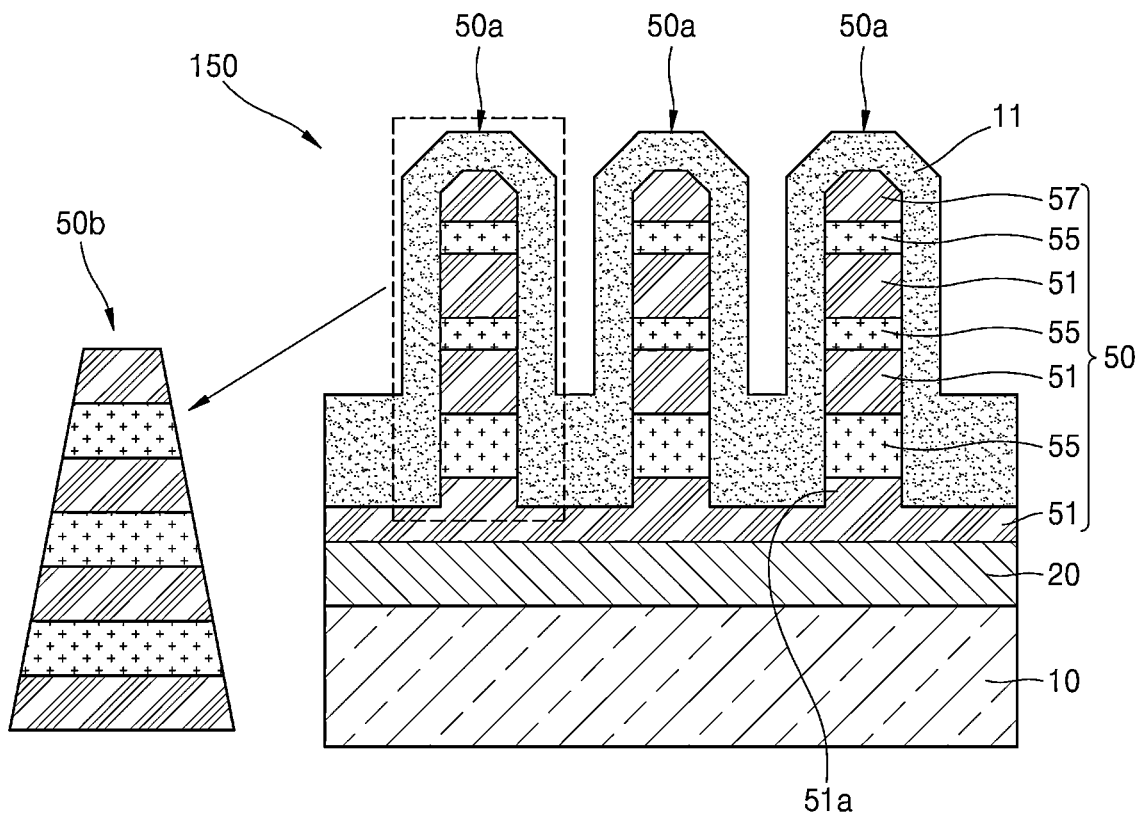

FIG. 9 is a cross-sectional view showing a nitride semiconductor device 150 according to another embodiment. Compared with the nitride semiconductor devices 130 and 140 of FIGS. 7 and 8, there is a difference in that the stack structure 50 is formed to include a plurality of first channel control layers 51 and a plurality of channel layers 55 by repeatedly stacking the first channel control layer 51 and the channel layer 55, and to include the second channel control layer 57 as the uppermost layer of the stack structure 50. In this case, a plurality of protrusions 51a may be formed on the first channel control layer 51 closest to the high-resistance material layer 20 from among the plurality of first channel control layers 51, and a stack structure 50 including repeated stacking of the channel layer 55 and the first channel control layer 51 may be formed on the protrusion 51a of the first channel control layer 51 to form a stack structure array 50a. As another example, as in the nitride semiconductor device 130 of FIG. 7, the stack structure 50 may be formed such that a plurality of protrusions 20a are formed on an upper surface of the high-resistance material layer 20, the first channel control layer 51 and the channel layer 55 are repeatedly stacked on the protrusion 20a of the high-resistance material layer 20, and the second channel control layer 57 is included as the uppermost layer.

In this way, by forming the stack structure 50 to include repeatedly stacked the first channel control layer 51 and the channel layer 55, each stack structure 50 of the stack structure array 50a may include a plurality of first channel control layers 51 and a plurality of channel layers 55, and thus, the nitride semiconductor device 150 according to another embodiment includes a plurality of channels. Accordingly, in the nitride semiconductor device 150 according to some example embodiments, because the plurality of fin-like stack structures 50 are formed in an array, and the plurality of channels are formed in a stacked structure, current density may be increased.

In the case of the nitride semiconductor device 150 according to some example embodiments, when the stack structure 50 includes a plurality of channel layers 55 by forming the stack structure 50 to include repeatedly stacked the first channel control layer 51 and the channel layer 55, the plurality of channel layers 55 may have the same thickness or different thicknesses from each other, or at least one channel layer 55 may have a thickness different from a thickness of other channel layers 55. The thickness of each of the plurality of channel layers 55 may be determined to obtain a desired current density.

Alternatively or additionally, as in the nitride semiconductor device 150 according to another embodiment, when the stack structure 50 is formed to include a plurality of channel layers 55 by repeatedly stacking the first channel control layer 51 and the channel layer 55, each stack structure 50 of the stack structure array 50a may be formed, for example, in a trapezoidal shape during patterning. In FIG. 9, reference numeral 50b indicates a stack structure patterned in a trapezoidal shape.

Figure 10:
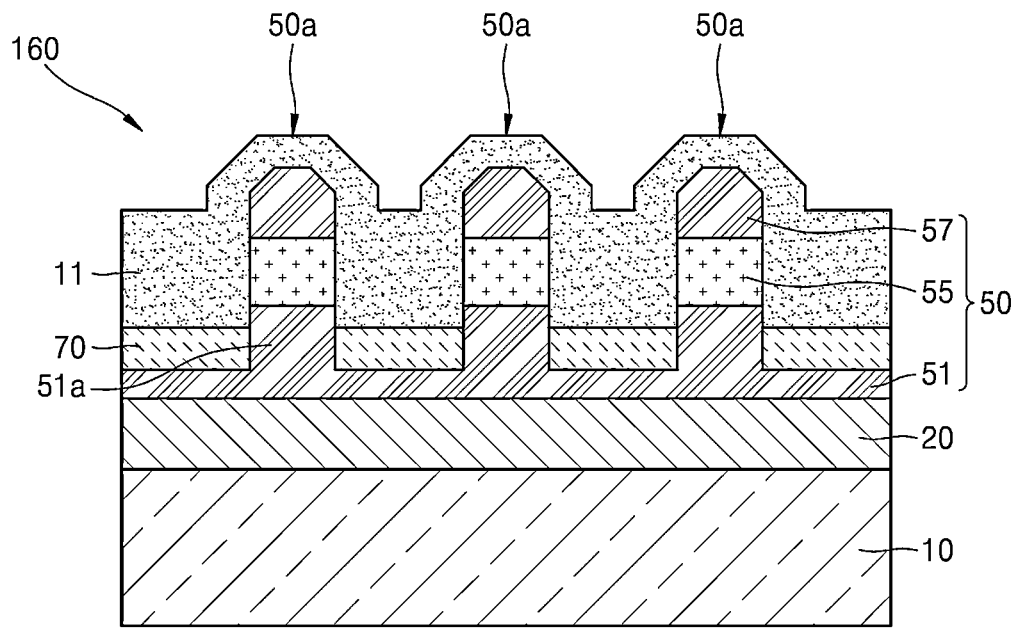

FIG. 10 is a cross-sectional view showing a nitride semiconductor device 160 according to another embodiment. Compared with the nitride semiconductor device 140 of FIG. 8, there is a difference in that a gate electrode is formed in a two-layer structure by further including a lower gate electrode 70 under the gate electrode 11 formed to surround the stack structure array 50a, that is, a plurality of fin-like stack structures 50. The lower gate electrode 70 may be provided to form a contact of an ohmic contact type with the first channel control layer 51 adjacent to the high-resistance material layer 20. The lower gate electrode 70 may also form a contact of an ohmic contact type with regions between the protrusions 51a of the first channel control layer 51 and the protrusions 51a of the first channel control layer 51. The gate electrode 11 may be formed to surround the stack structure array 50a on the lower gate electrode 70, may form a contact of an ohmic contact type with the second channel control layer 57, and may form a Schottky contact with the channel layer 55. In the nitride semiconductor device 160 according to another embodiment, the source electrode 13 and the drain electrode 15 may be formed to form an ohmic contact with the channel layer 55 of each stack structure 50.

Figure 11:
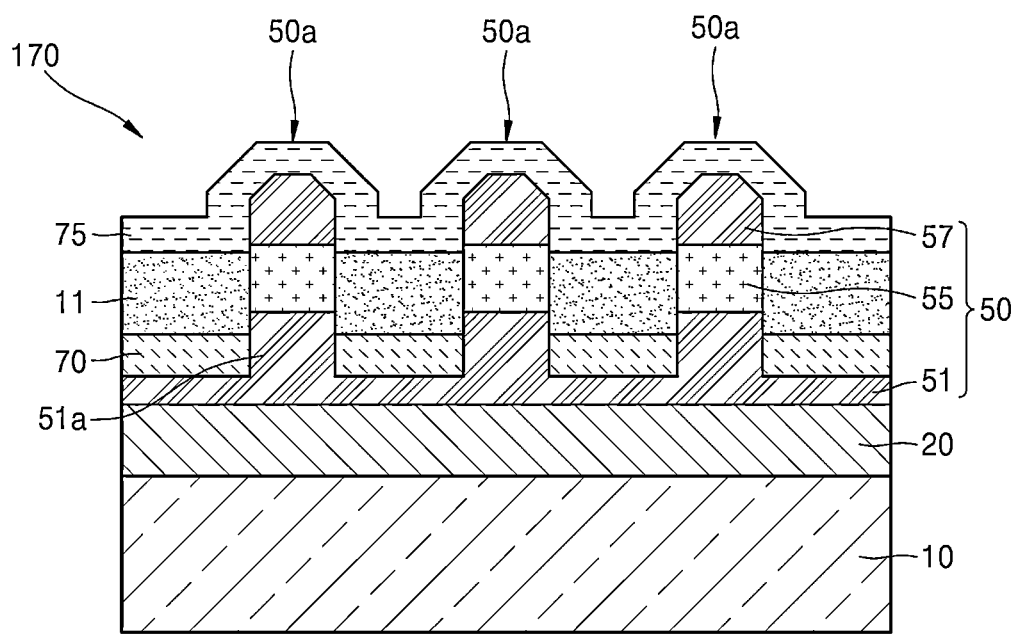

FIG. 11 is a cross-sectional view showing a nitride semiconductor device 170 according to another embodiment. Compared with the nitride semiconductor device 160 of FIG. 10, there is a difference in that the gate electrode 11 is provided to form a Schottky contact with the channel layer 55, and a gate electrode is formed in a three-layered structure of a lower gate electrode 70, a gate electrode 11, and an upper gate electrode 75 by further including the upper gate electrode 75 forming a contact of an ohmic contact type with the second channel control layer 57 on the gate electrode 11.

The three-layered gate electrode may be formed to surround the stack structure array 50a, that is, a plurality of fin-like stack structures 50. The lower gate electrode 70 may be provided to form a contact of an ohmic contact type with the first channel control layer 51 adjacent to the high-resistance material layer 20. The lower gate electrode 70 may form a contact of an ohmic contact type with regions between the protrusions 51a of the first channel control layer 51 and with the protrusions 51a of the first channel control layer 51. The gate electrode 11 may be provided to form a Schottky contact with the channel layer 55. The upper gate electrode 75 may be provided to form a contact of an ohmic contact type with the second channel control layer 57. In the nitride semiconductor device 170 according to some example embodiments, the source electrode 13 and the drain electrode 15 may be provided to form an ohmic contact with the channel layer 55 of each stack structure 50.

As in example embodiments, the gate electrode may be formed in a multi-layered structure to correspond to the first channel control layer 51, the channel layer 55, and the second channel control layer 57, respectively. As described above, the forming of the gate electrode in a multi-layered structure to correspond to the first channel control layer 51, the channel layer 55, and the second channel control layer 57, respectively, as in the nitride semiconductor device 150 of FIG. 9, may also be applied to the case when the stack structure 50 is formed to include the repeated stack of the first channel control layer 51 and the channel layer 55 and the second channel control layer 57 as the uppermost layer. In this case, the gate electrode may be formed to surround the stack structure array 50a, that is, a plurality of fin-like stack structures 50, wherein the gate electrode may be formed to have a structure in which the lower gate electrode 70 and the gate electrode 11 are repeatedly formed to correspond to the repeated stack of the first channel control layer 51 and the channel layer 55, and, the upper gate electrode 75 is formed on the repeated stack of the lower gate electrode 70 and the gate electrode 11 to correspond to the second channel control layer 57 of the uppermost layer.

In the above, in the nitride semiconductor devices 1, 110, 120, 130, 140, 150, 160, and 170 according to some example embodiments, it has been described and illustrated as that the gate electrode forms a Schottky contact with the channel layer 55 and forms a contact of an ohmic contact type with the first and second channel control layers 51 and 57, but example embodiments are not limited thereto. For example, the nitride semiconductor devices 1, 110, 120, 130, 140, 150, 160, and 170 according to the embodiments may further include an insulator on sidewalls of the stack structure 50 to electrically separate the gate electrode from the channel layer 55.

Figure 12:
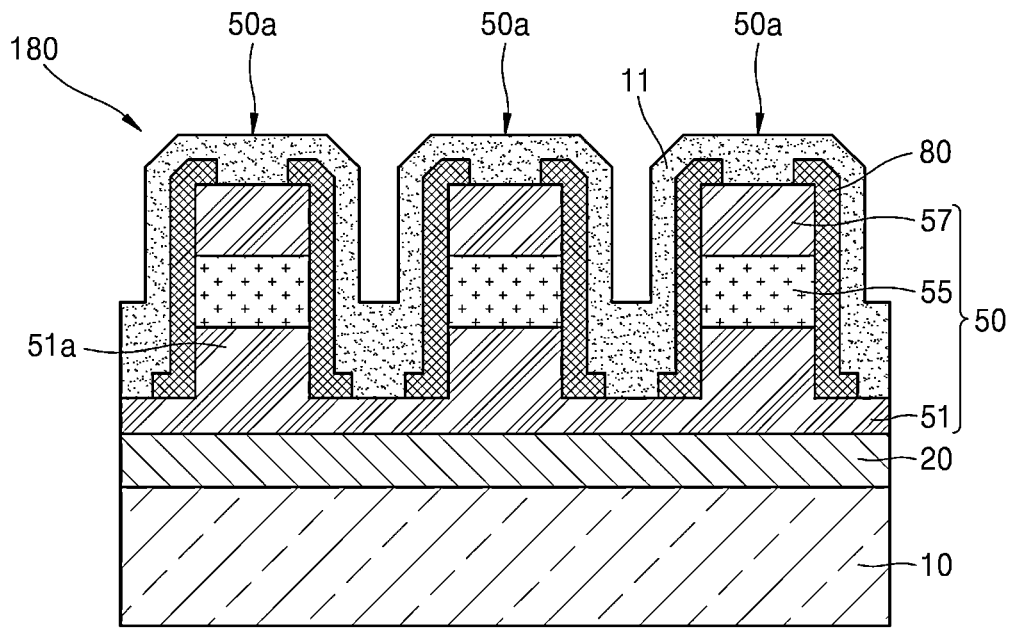

FIG. 12 is a cross-sectional view showing a nitride semiconductor device 180 according to another embodiment. FIG. 12 shows a case in which, when the nitride semiconductor device 180 includes the stack structure 50 of FIG. 7, an insulator 80 is provided to electrically separate the gate electrode 11 from the channel layer 55. The insulator 80 may be applied to the nitride semiconductor devices 1, 110, 120, 130, 140, 150, 160, and 170 according to various example embodiments described above with reference to FIGS. 1 to 11. That is, the nitride semiconductor devices 1, 110, 120, 130, 140, 150, 160, and 170 according to various example embodiments described above may be changed to further include the insulator 80 electrically separating the gate electrode 11 from the channel layer 55.

Referring to FIG. 12, the insulator 80 may be formed to surround sidewalls of the stack structure 50 while opening, for example, a region between the protrusions 51a of the first channel control layer 51 and an upper end of the second channel control layer 57. In this case, the gate electrode 11 may be provided to form a contact of an ohmic contact type with the second channel control layer 57 at an upper end of the stack structure 50, and to form a contact of an ohmic contact type with the first channel control layer 51 in a region between the protrusions 51a of the first channel control layer 51.

Not only in the case of the nitride semiconductor devices 1, 110, 120, 130, 140, 150, 160, and 170 according to various embodiments described with reference to FIGS. 1, and 7 to 11, but also in the case of the nitride semiconductor device 180 of FIG. 12, an insulator may further be included to provide electrical insulation between sidewalls of the channel layer 55 and the gate electrode 11. At this point, for example, when the stack structure 50 is formed not to include an insulator between at least one sidewall of the first and second channel control layers 51 and 57 and the gate electrode 11, a contact corresponding to an ohmic contact may be formed between the at least one sidewall of the first and second channel control layers 51 and 57 and the gate electrode 11 on a sidewall of the stack structure 50.

In the above, in the nitride semiconductor devices 1, 110, 120, 130, 140, 150, 160, 170, and 180 according to the embodiments described above, it has been described and illustrated that the stack structure 50 includes at least one first channel control layer 51, at least one channel layer 55, and the second channel control layer 57, but the embodiments are not limited thereto.

Figure 13A:
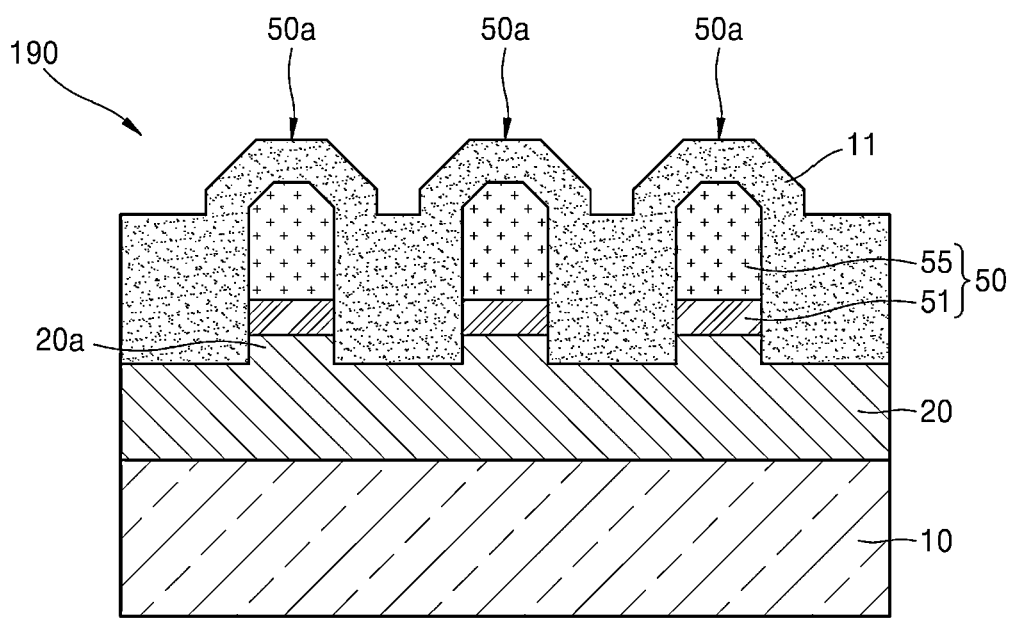
Figure 13B:
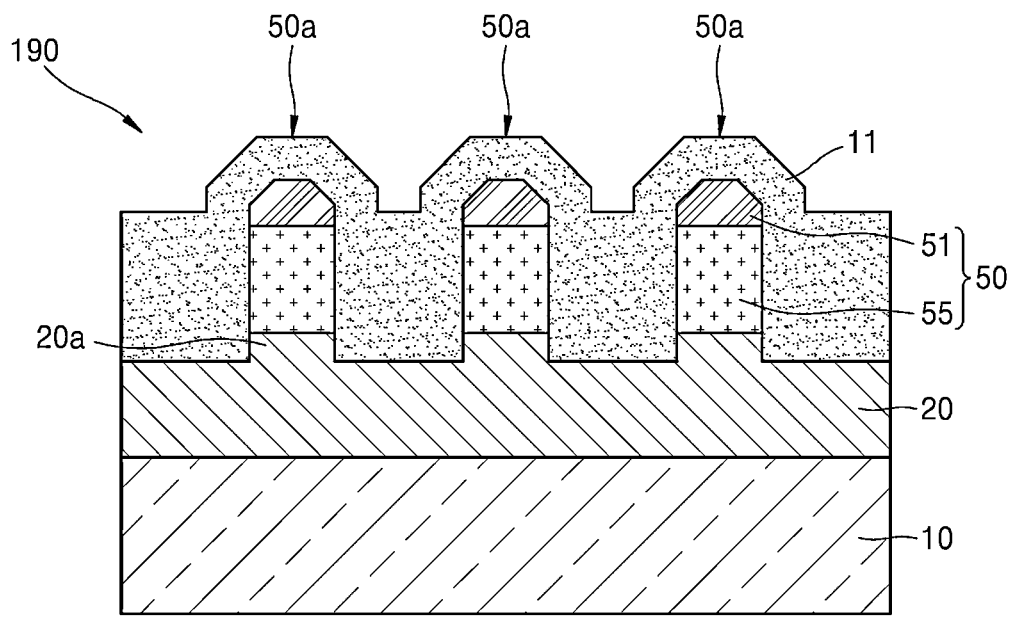

FIGS. 13A and 13B show a nitride semiconductor device 190 according to another embodiment. Referring to FIGS. 13A and 13B, the protrusion 20a may be formed by patterning the high-resistance material layer 20, the stack structure 50 including the first channel control layer 51 and the channel layer 55 may be formed on the protrusion 20a of the high-resistance material layer 20, and the gate electrode 11 may be formed to surround the stack structure 50. For example, as shown in FIG. 13A, the stack structure 50 may be formed to include the first channel control layer 51 on the protrusion 20a of the high-resistance material layer 20 and the channel layer 55 on the first channel control layer 51, and the gate electrode 11 may be formed to surround the stack structure 50. Also, for example, as shown in FIG. 13B, the stack structure 50 may be formed to include the channel layer 55 on the protrusion 20a of the high-resistance material layer 20 and the first channel control layer 51 on the channel layer 55, and the gate electrode 11 may be formed to surround the stack structure 50.

Figure 14:
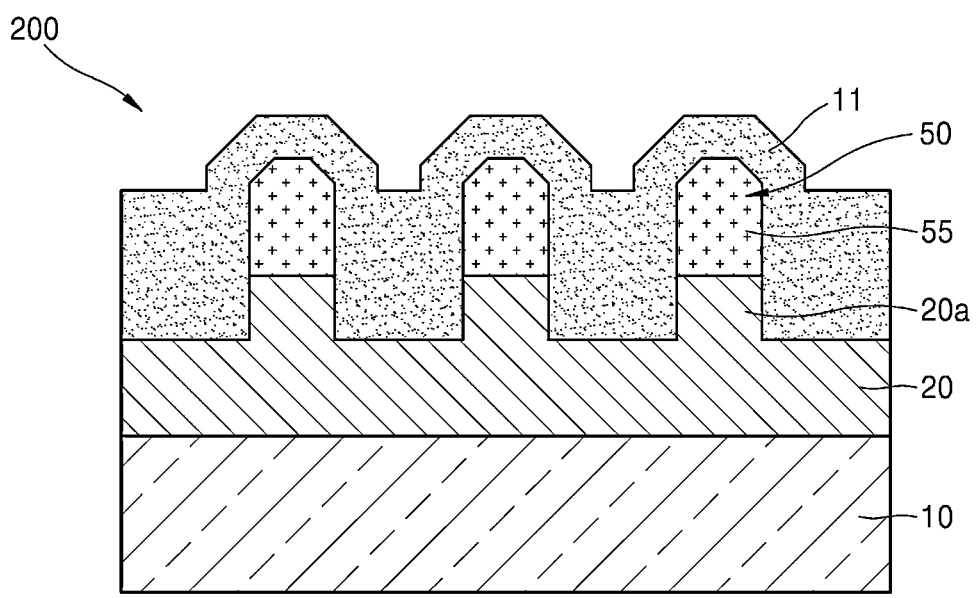

As described above, the nitride semiconductor device 190 according to another embodiment may be implemented as, for example, a two-layer type (an n-p-type or a p-n-type) device. That is, the stack structure 50 may include the first channel control layer 51 as a lower layer and the channel layer 55 as an upper layer, or the channel layer 55 as a lower layer and the first channel control layer 51 as an upper layer FIG. 14 shows a nitride semiconductor device 200 according to another embodiment. As another example, as shown in FIG. 14, the protrusion 20a may be formed by patterning the high-resistance material layer 20, the stack structure 50 including the channel layer 55 is formed on the protrusion 20a of the high-resistance material layer 20, and the gate electrode 11 may be formed to surround the stack structure 50. The nitride semiconductor device 200 according to another embodiment may include the high-resistance material layer 20, the channel layer 55 provided on the high-resistance material layer 20 and including a nitride semiconductor of one conductivity type, and the gate electrode 11 provided to form a contact of a Schottky contact type with the channel layer 55 or to provide an electrical insulation from the channel layer 55. In the nitride semiconductor device 200 according to another embodiment, the channel layer 55 may include, for example, n-type GaN.

As described above, the nitride semiconductor device 200 according to another embodiment may be implemented as, for example, a one-layer type (an n-type or a p-type) device.

That is, the stack structure 50 may be formed to include the channel layer 55 on the protrusion 20a of the high-resistance material layer 20, and the gate electrode 11 may be formed to surround the stack structure 50.

In the nitride semiconductor devices 1, 110, 120, 130, 140, 150, 160, 170, and 180 according to various embodiments described with reference to FIGS. 7 to 12, the second channel control layer 57 may exist to regions other than the gate region as shown in FIG. 5 or may be removed from the regions other than the gate region as shown in FIG. 6.

Figure 15:
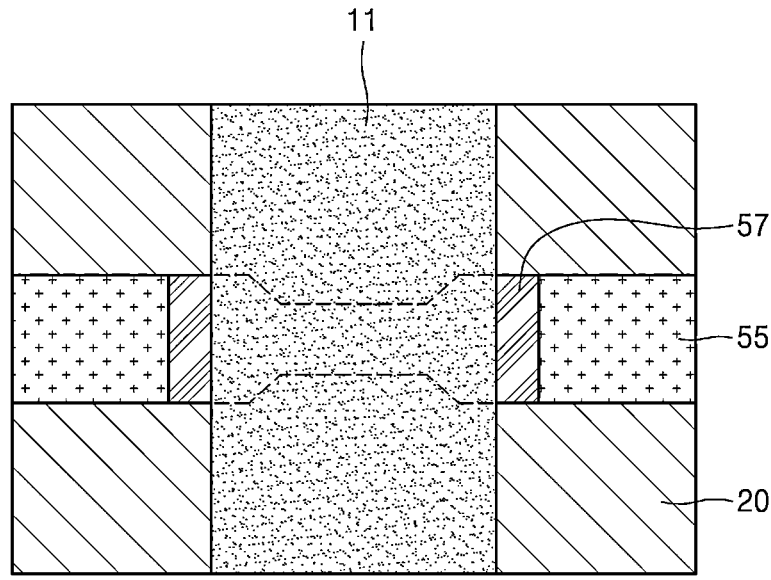
FIGS. 15 and 16 are plan views showing an example of patterning a channel to implement an enhancement-mode (E-mode) by reducing a width of the gate region when a nitride semiconductor device according to various embodiments has a stack structure array formed in a fin-like structure in a horizontal direction and a second channel control layer has a structure in which the second channel control layer is removed from regions other than a gate region as in FIG. 6.
Figure 16:
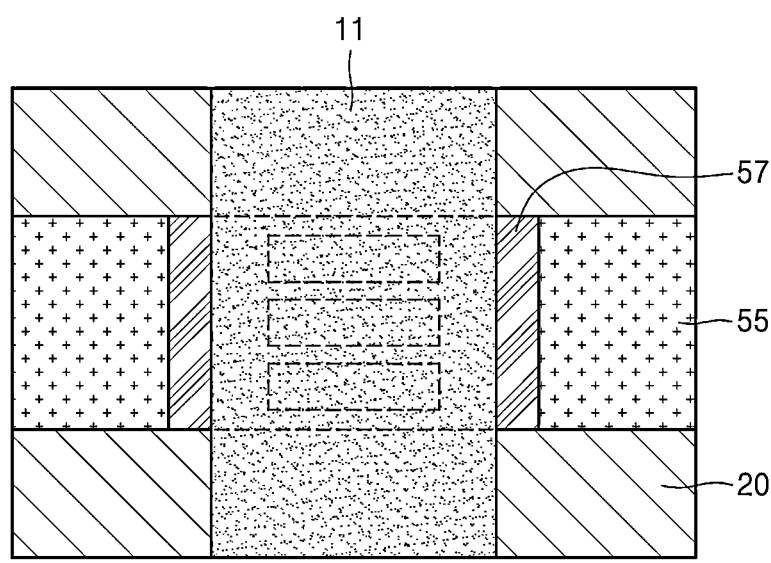

FIGS. 15 and 16 are plan views showing an example of patterning a channel to implement an enhancement mode by reducing a width of a gate region when the nitride semiconductor devices according to various example embodiments described above have a stack structure array 50a in which a fin-like structure is formed in a horizontal direction and the second channel control layer 57 is removed from the regions other than the gate region as shown in FIG. 6.

As in FIGS. 15 and 16, a channel formed by the stripe-shaped stack structure 50 may be patterned to reduce an area of the gate region where the gate electrode 11 overlaps. The patterning of the channel may be performed to secure a desired width of the gate region when the stack structure 50 is patterned to a fin-like structure in a horizontal direction to form an array.

FIG. 15 shows an example of patterning a channel to reduce a width of the channel in the gate region compared to a width in the remaining regions. FIG. 16 shows an example of patterning a channel in a form in which a plurality of portions of the channel are removed in the gate region. FIGS. 15 and 16 show examples of patterning channels to reduce an area of the gate region for one stack structure from among the plurality of stack structure arrays 50a, and the channel patterning may be performed for each of the plurality of stack structure arrays 50a.

Figure 17:
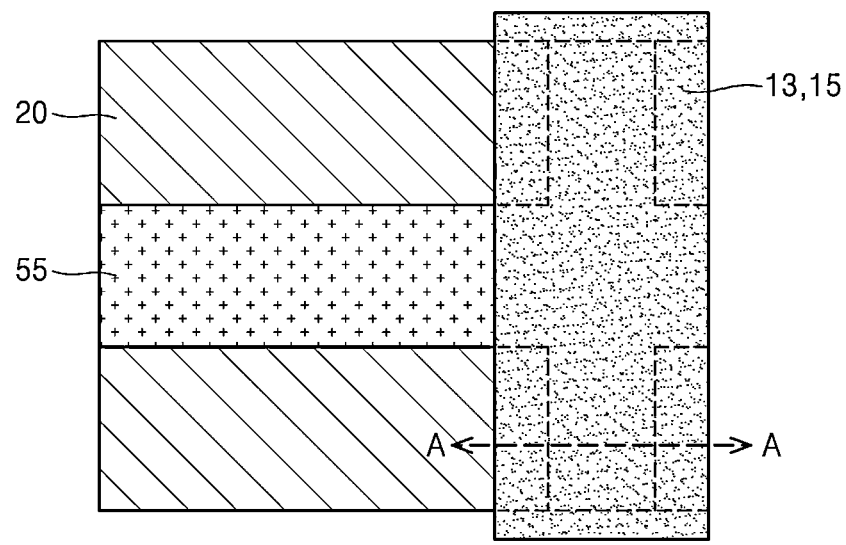
FIG. 17 is a plan view showing an example of patterning of a stack structure at a portion of a source electrode or a drain electrode when a nitride semiconductor device according to various example embodiments described above has a stack structure array formed a fin-shaped structure in a horizontal direction and the second channel control layer is removed from regions other than a gate region.
Figure 18:
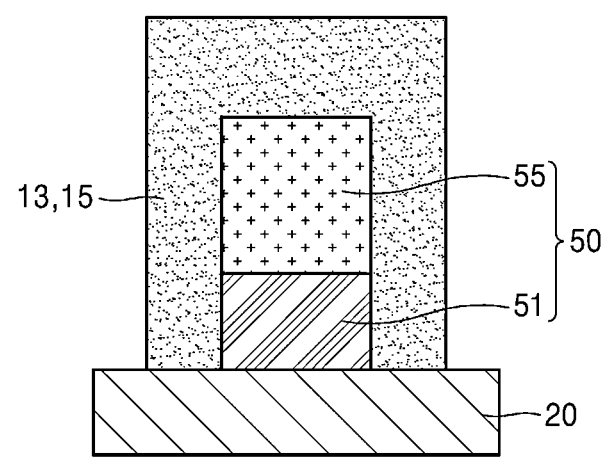
FIGS. 18 and 19 are schematic cross-sectional views taken along line A-A of FIG. 17.
Figure 19:
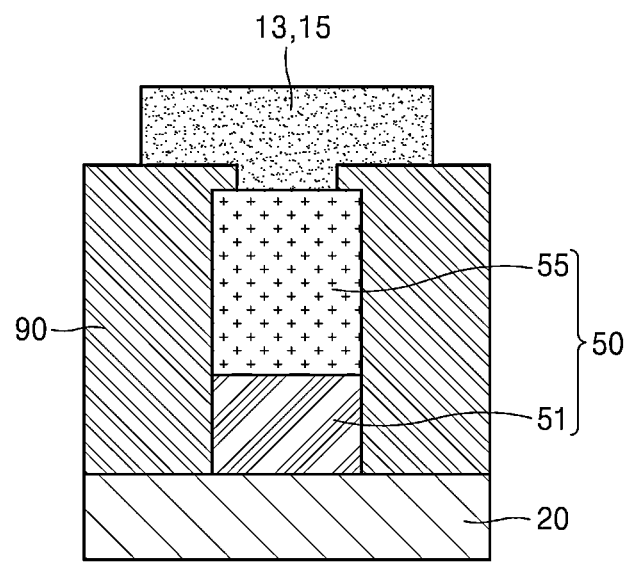

FIG. 17 shows an example of pattering the stack structure 50 in portions of the source electrode 13 or the drain electrode 15 when the nitride semiconductor devices according to various embodiments described above include a stack structure array 50a formed in a fin-like structure in a horizontal direction and has a structure in which the second channel control layer 57 is removed from regions other than the gate region. FIGS. 18 and 19 show schematic cross-sectional views taken along line A-A of FIG. 17.

Referring to FIG. 17, when the nitride semiconductor device according to some example embodiments is provided to include a stack structure array 50a formed in a fin-like structure in a horizontal direction, for example, the stack structure 50 may be patterned so that a connection exists between the stack structure arrays 50a through the channel layer 55 in at least a portion of the source electrode 13 or the drain electrode 15.

In this case, as shown in FIG. 18, the source electrode 13 or the drain electrode 15 may be formed to surround the patterned stack structure 50. In this case, the source electrode 13 or the drain electrode 15 may be provided to form an ohmic contact with the channel layer 55 and to form a Schottky contact with the first channel control layer 51.

As another example, in a portion of the source electrode 13 and/or drain electrode 15, as shown in FIG. 19, a passivation 90 is formed to surround sidewalls of the patterned stack structure 50 and the source electrode 13 or the drain electrode 15 may be provided to form an ohmic contact with the channel layer 55 on an upper surface of the stack structure 50.

Figure 20:
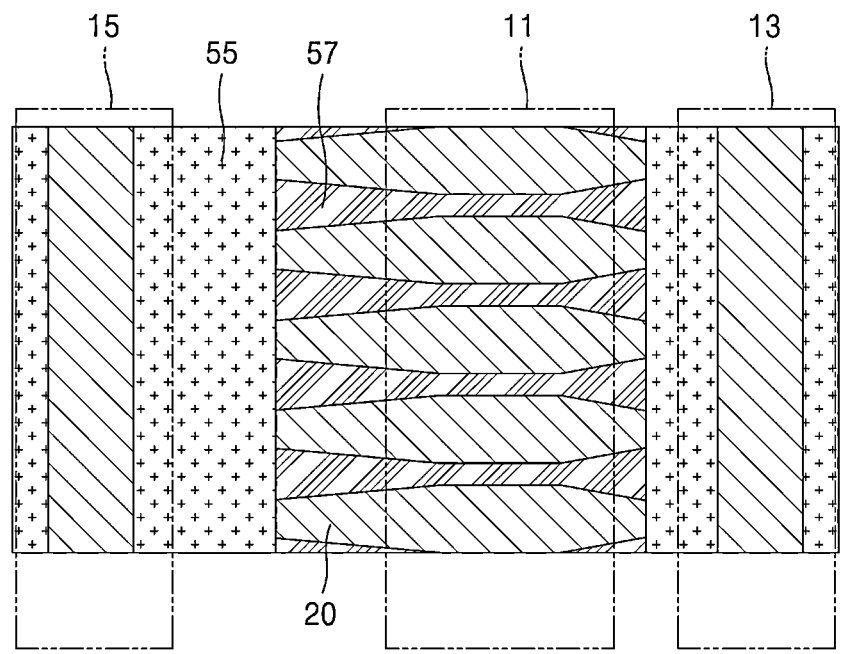
FIG. 20 is a plan view showing an example of forming a stack structure array in a fin-like structure in a horizontal direction in the entire region (including a gate region) in which a second channel control layer is left when a nitride semiconductor device according to various embodiments has a structure in which the second channel control layer is left only in a portion where the stack structure array is formed.

FIG. 20 is a plan view showing an example of forming the stack structure array 50a in a fin-like structure in a horizontal direction in an entire region (including the gate region) where the second channel control layer 57 is left when the nitride semiconductor devices according to various embodiments described above have a structure in which the second channel control layer 57 is left only in a portion where the stack structure array 50a is formed.

As shown in FIG. 20, the second channel control layer 57 may be formed to be left only in regions where the stack structure arrays 50a are formed, and the connection between the stack structure arrays 50a in a portion of the source electrode 13 and/or drain electrode 15 may be secured by an unpatterned portion of the channel layer 55.

As shown in FIG. 20, when the stack structure array 50a is formed in a region where the second channel control layer 57 is left, in order to reduce an area of a gate region where the gate electrode 11 overlaps, a width of the channel may be varied so that a channel formed by the stack structure array 50a has a small width in a portion overlapping the gate electrode 11 and has a greater width in a portion not overlapping the gate electrode 11, and accordingly, a field may be mitigated.

Figure 21:
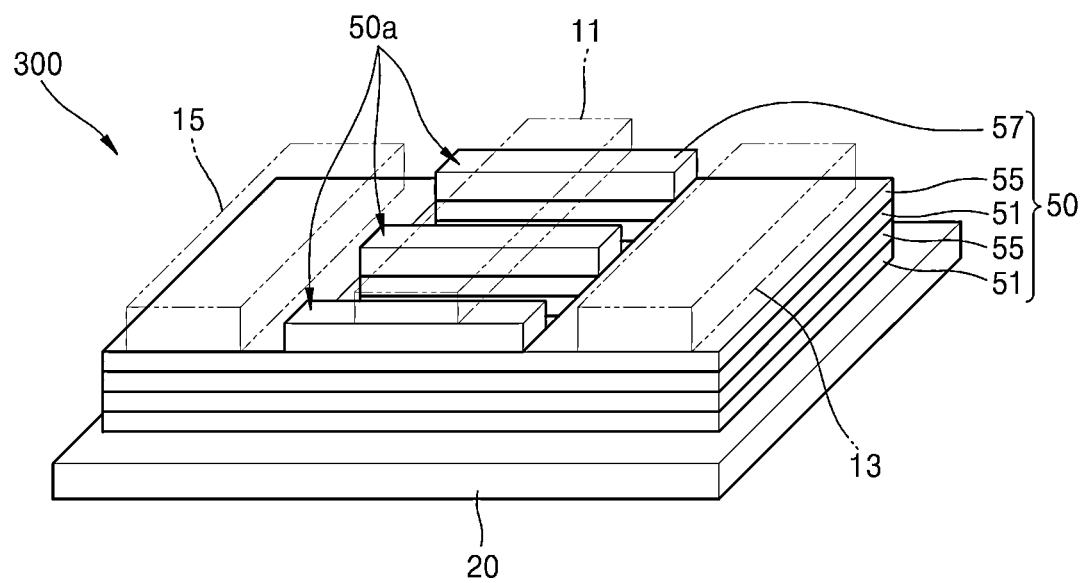
FIG. 21 is a schematic perspective view illustrating an overall structure of a nitride semiconductor device according to another embodiment.

FIG. 21 is a schematic perspective view showing an overall structure of a nitride semiconductor device 300 according to another embodiment. Compared with the nitride semiconductor device 120 of FIG. 6 described above, FIG. 21 shows that the stack structure 50 includes a plurality of channels by including the first channel control layer 51 and the channel layer 55 that are repeatedly stacked and the second channel control layer 57 as the uppermost layer, and a stack structure array 50a is formed only in a partial region including the gate region. FIG. 21 shows an example in which the second channel control layer 57 is removed from regions of the source electrode 13 and the drain electrode 15, and the stack structure arrays 50a is formed in a fin-like structure in a horizontal direction only in regions where the second channel control layer 57 is left (a drift region). Also, FIG. 21 shows a case in which the stack structure 50 includes the first channel control layer 51-the channel layer 55-the first channel control layer 51-the channel layer 55-the second channel control layer 57, this is an example, and the number of repeated stacking of the first channel control layer 51 and the channel layer 55 may vary. Also, in FIG. 21, it is simply illustrated that the gate electrode 11 is positioned on the stack structure 50. However, as it may be seen from the cross-sectional views showing various example embodiments described above, the gate electrode 11 may be provided to surround the stack structure 50 to form a contact of an ohmic contact type with the plurality of first channel control layers 51 and the second channel control layer 57 of the uppermost layer of the stack structure 50. Alternatively or additionally, the gate electrode 11 may form a Schottky contact with the plurality of channel layers 55 of the stack structure 50, or may include an insulator therebetween.

Referring to FIG. 21, the nitride semiconductor device 300 according to another embodiment may include the stack structure 50 including repeated stacking of the first channel control layer 51 and the channel layer 55 and the second channel control layer 57 as the uppermost layer, and may include a region including the stack structure array 50a and regions for forming an electrical contact with the source electrode 13 and the drain electrode 15 and the channel layer 55. The drift region is a region between the source electrode 13 and the drain electrode 15, and in the drift region, the stack structure 50 may be patterned to form a stack structure array 50a in a fin-like structure in a horizontal direction.

As shown in FIG. 21, when the stack structure 50 has a structure including the plurality of first channel control layers 51, the plurality of channel layers 55, and the second channel control layer 57 of the uppermost layer, and is patterned to form the stack structure array 50*a* in the drift region, in order to form an ohmic contact with the source electrode 13 or the drain electrode 15 and the plurality of channel layers 55 of the stack structure 50, the source electrode 13 or the drain electrode 15 may be formed as shown in FIGS. 22A, 22B, 23A, and 23B, or provided to form a contact as shown in FIGS. 24, 25A, 25B, and 25C.

For example, an electrical connection between the plurality of channel layers 55 and the source electrode 13 or the drain electrode 15 may be formed to correspond to the stack structure array 50*a* as shown in FIGS. 22A, 22B, 23A, and 23B, or may be formed to correspond to each channel layer 55 of the stack structure 50 as shown in FIGS. 24 and 25A to 25C.

Figure 22A:
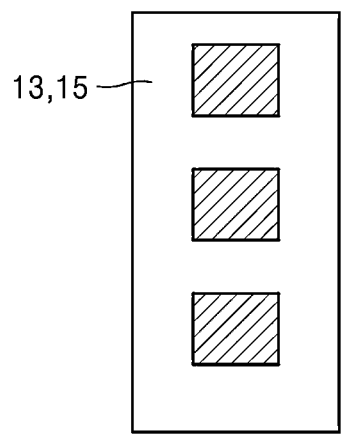
FIGS. 22A and 22B diagrams showing examples of a source electrode (drain electrode) forming an ohmic contact with a channel layer of a stack structure array.
Figure 22B:
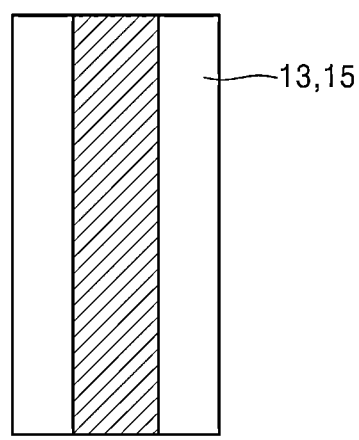
Figure 23A:
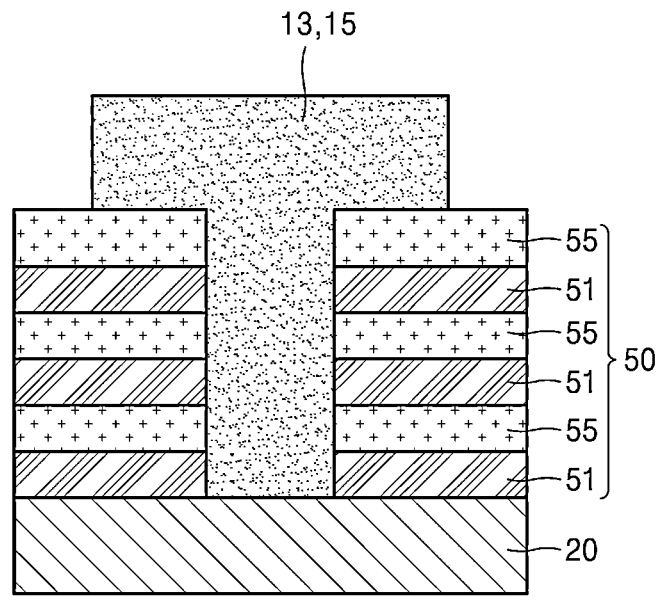
FIGS. 23A and 23B are cross-sectional views of a portion in which an ohmic contact is formed with the source electrode (drain electrode) of FIG. 21.
Figure 23B:
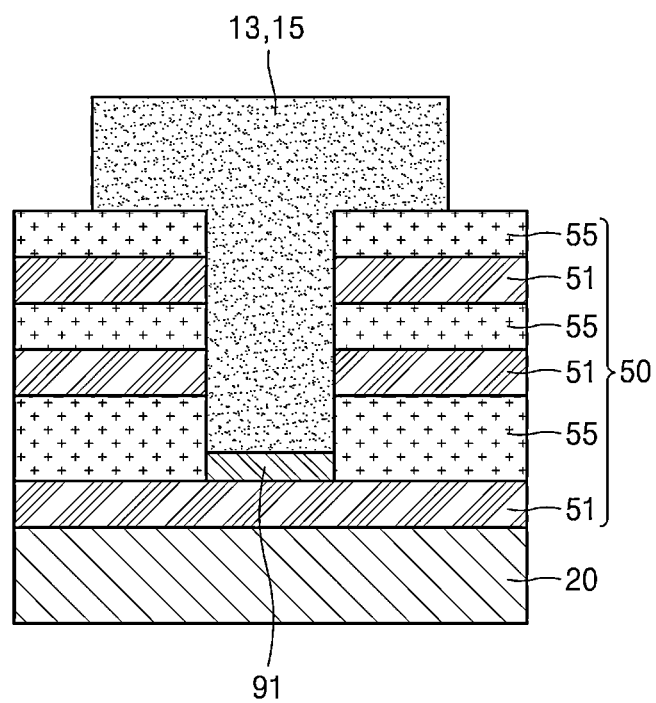

FIGS. 22A and 22B show examples of the source electrode 13 (drain electrode 15) forming an ohmic contact with the channel layer 55 of the stack structure array 50*a*, and FIGS. 23A and 23B are cross-sectional views of a portion where an ohmic contact is formed with the source electrode 13 (a drain electrode 15) of FIG. 21.

Referring to FIG. 22A, an electrical connection between the plurality of channel layers 55 of the stack structure array 50*a* formed in a fin-like structure in a horizontal direction and the source electrode 13 or the drain electrode 15 may be formed to correspond to the stack structure array 50*a*. For example, the electrical connection between the plurality of channel layers 55 of the stack structure array 50*a* and the source electrode 13 or the drain electrode 15 may be formed in a region corresponding to the stack structure array 50*a*.

In addition, referring to FIG. 22B, the electrical connection between the plurality of channel layers 55 of the stack structure array 50*a* formed in a fin-like structure in a horizontal direction and the source electrode 13 or the drain electrode 15 may be formed in a straight contact area in a direction connecting the stack structure arrays 50*a*.

To this end, as shown in FIG. 23A or 23B, a hole corresponding to the stack structure array 50*a* and/or a straight trench in a direction connecting the stack structure arrays 50*a* may be formed in a portion of the stack structure 50 where the source electrode 13 (the drain electrode 15) is formed to correspond to the stack structure array 50*a*. Also, an ohmic contact may be formed between the plurality of channel layers 55 of the stack structure 50 and the source electrode 13 or the drain electrode 15 by filling the hole or the straight trench with a metal or a metallic material.

For example, as shown in FIG. 23A, a plurality of holes or straight trenches may be formed to correspond to the stack structure array 50*a* up to an upper surface of the high-resistance material layer 20 in the stack structure 50, and the holes or the straight trenches of the stack structure 50 may be filled with a metal or a metallic material to form an ohmic contact between the plurality of channel layers 55 and the source electrode 13 or the drain electrode 15.

As another example, as shown in FIG. 23B, a plurality of holes or straight trenches are formed in the stack structure 50 to correspond to the stack structure array 50*a* up to the first channel control layer 51 adjacent to the high-resistance material layer 20, a passivation layer 91 may be formed up to a partial height of the adjacent channel layer 55 on the remaining first channel control layer 51 in the hole or the straight trench, and the holes or the straight trenches of the stack structure 50 may be filled with a metal or a metallic material to form an ohmic contact between the plurality of channel layers 55 and the source electrode 13 or the drain electrode 15.

Figure 24:
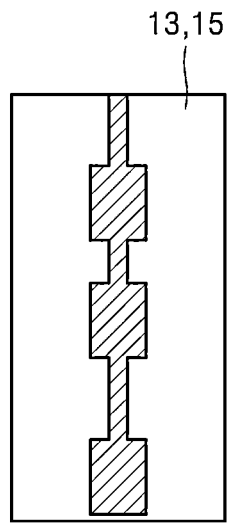
FIG. 24 is a diagram shows another example of a source electrode (drain electrode) forming an ohmic contact with the stack structure array.
Figure 25A:
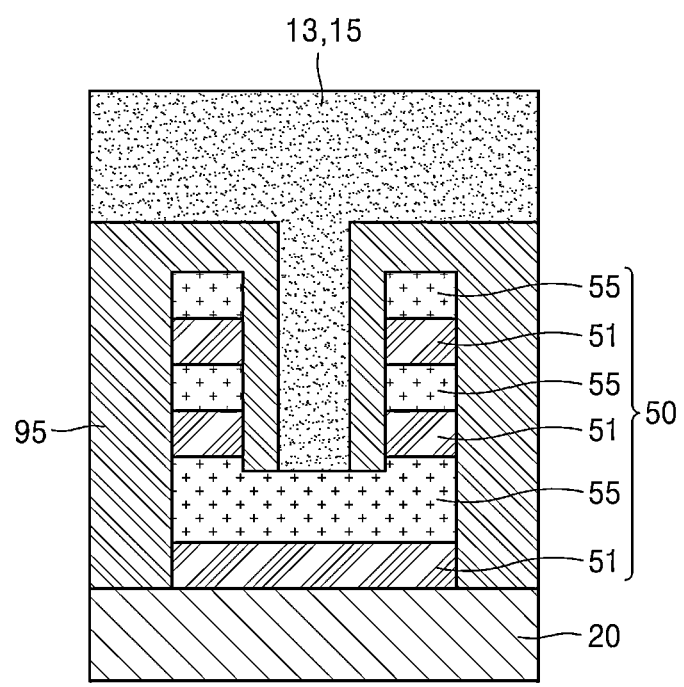
FIGS. 25A to 25C are cross-sectional views of a portion in which an ohmic contact is formed with a source electrode (drain electrode) of FIG. 24.
Figure 25B:
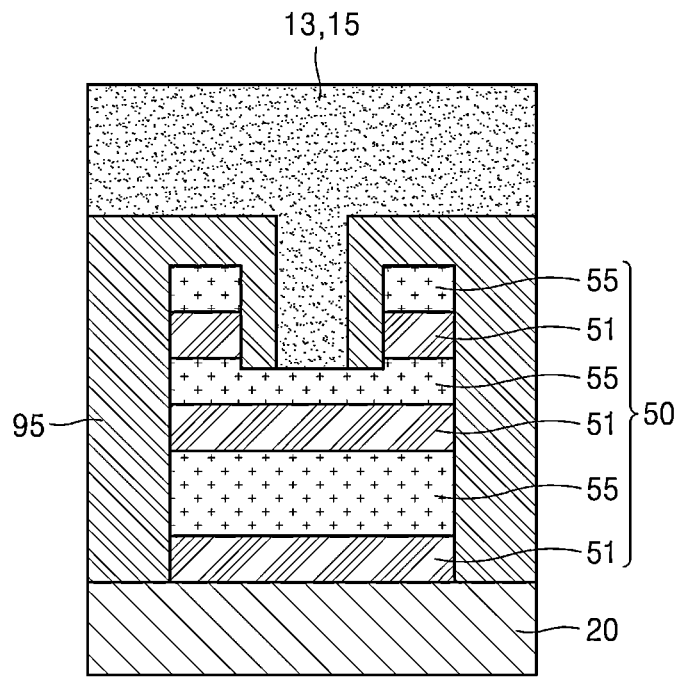
Figure 25C:
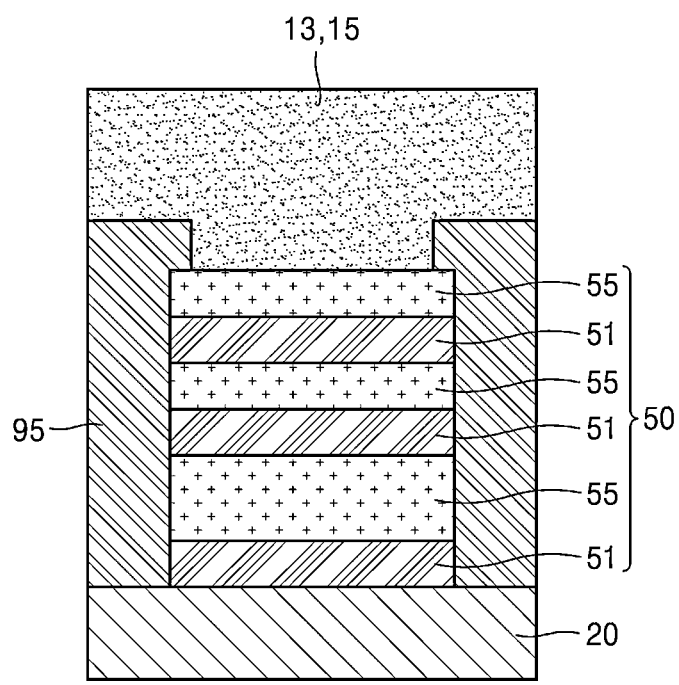

FIG. 24 shows another example of the source electrode 13 (drain electrode 15) forming an ohmic contact with the stack structure array 50*a*, and FIGS. 25A to 25C are cross-sectional views showing a portion of the stack structure array 50*a* forming an ohmic contact with the source electrode 13 (drain electrode 15) of FIG. 24.

Referring to FIG. 24, a portion where an electrical connection is formed between the plurality of channel layers 55 of the stack structure 50 and the source electrode 13 or the drain electrode 15 is formed to correspond to the stack structure array 50*a*, and the portions where the electrically connection is formed may be connected to each other for each channel layer 55 of the stack structure 50.

To this end, as shown in FIGS. 25A and 25B, a hole is formed up to a position of each channel layer of the plurality of channel layers 55 to correspond to the stack structure array 50*a*, a passivation layer 95 is formed to surround sidewalls of the stack structure 50 and sidewalls of the hole, at this point, a bottom part of the hole is opened for electrical contact with the corresponding channel layer 55, and the hole may be filled with a metal or a metallic material to form an ohmic contact between the corresponding channel layer and the source electrode 13 (drain electrode 15).

In addition, with respect to the uppermost channel layer among the plurality of channel layers 55, as shown in FIG. 25C, a passivation layer 95 may be formed so as to open the uppermost channel layer while surrounding sidewalls of the stack structure 50, and the uppermost channel layer may be formed to form an ohmic contact with the source electrode 13 (the drain electrode 15) by forming an ohmic contact with the uppermost channel layer using a metal or a metallic material.

In FIGS. 21, 22, 23A, 23B, 24, 25A, 25B, and 25C, in the regions where the source electrode 13 and the drain electrode 15 are formed, it is depicted that the second channel control layer 57 is removed, but the embodiments are not limited thereto. For example, in a state that the second channel control layer 57 is not removed from the regions where the source electrode 13 and the drain electrode 15 are formed, the plurality of channel layers 55 of the stack structure 50 may be provided to form an ohmic contact with the source electrode 13 and the drain electrode 15.

Figure 26:
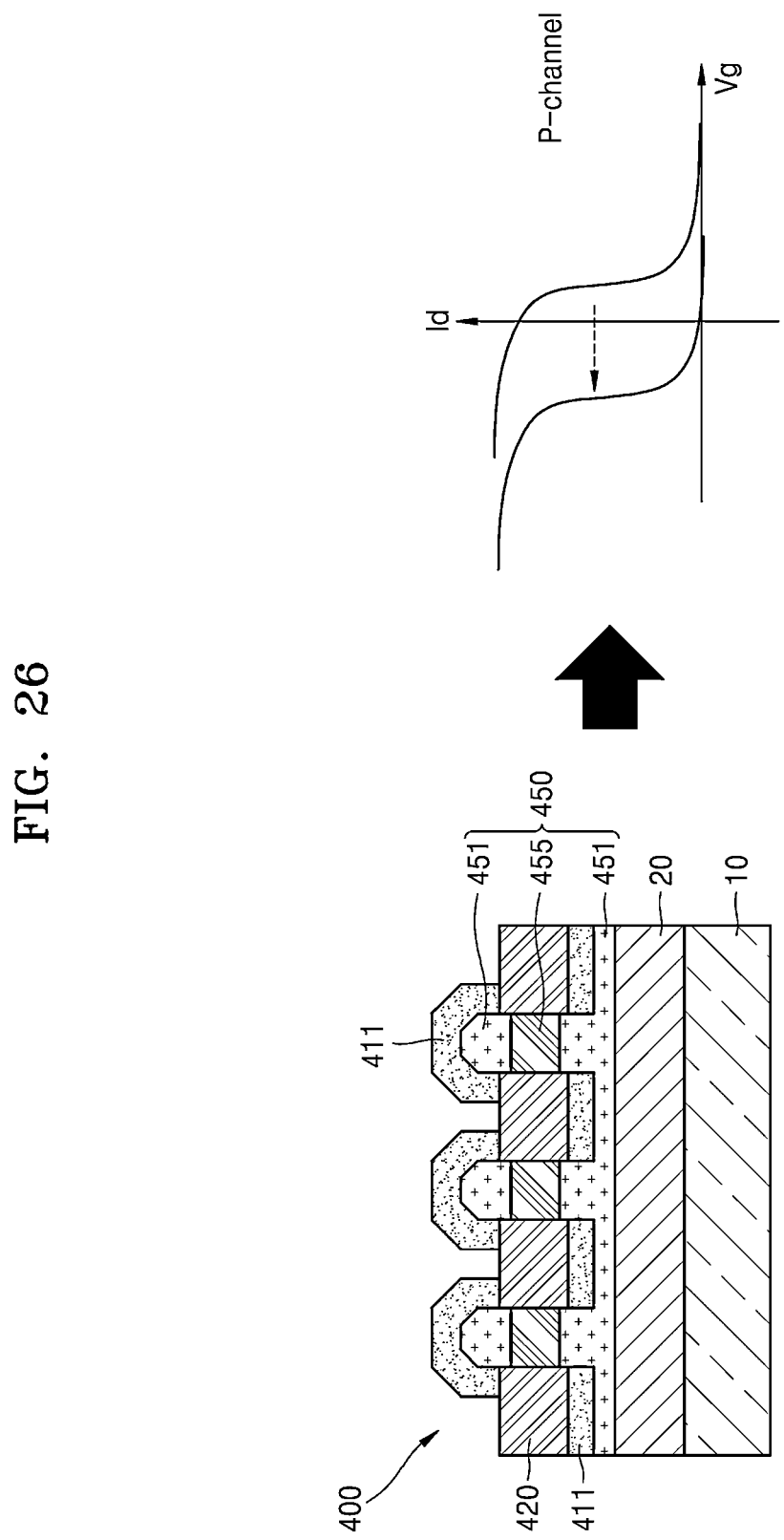
FIG. 26 is a diagram showing a change in current flowing through a channel according to a gate voltage when a nitride semiconductor device according to another embodiment is prepared to implement an E-mode of a P-channel.
Figure 27:
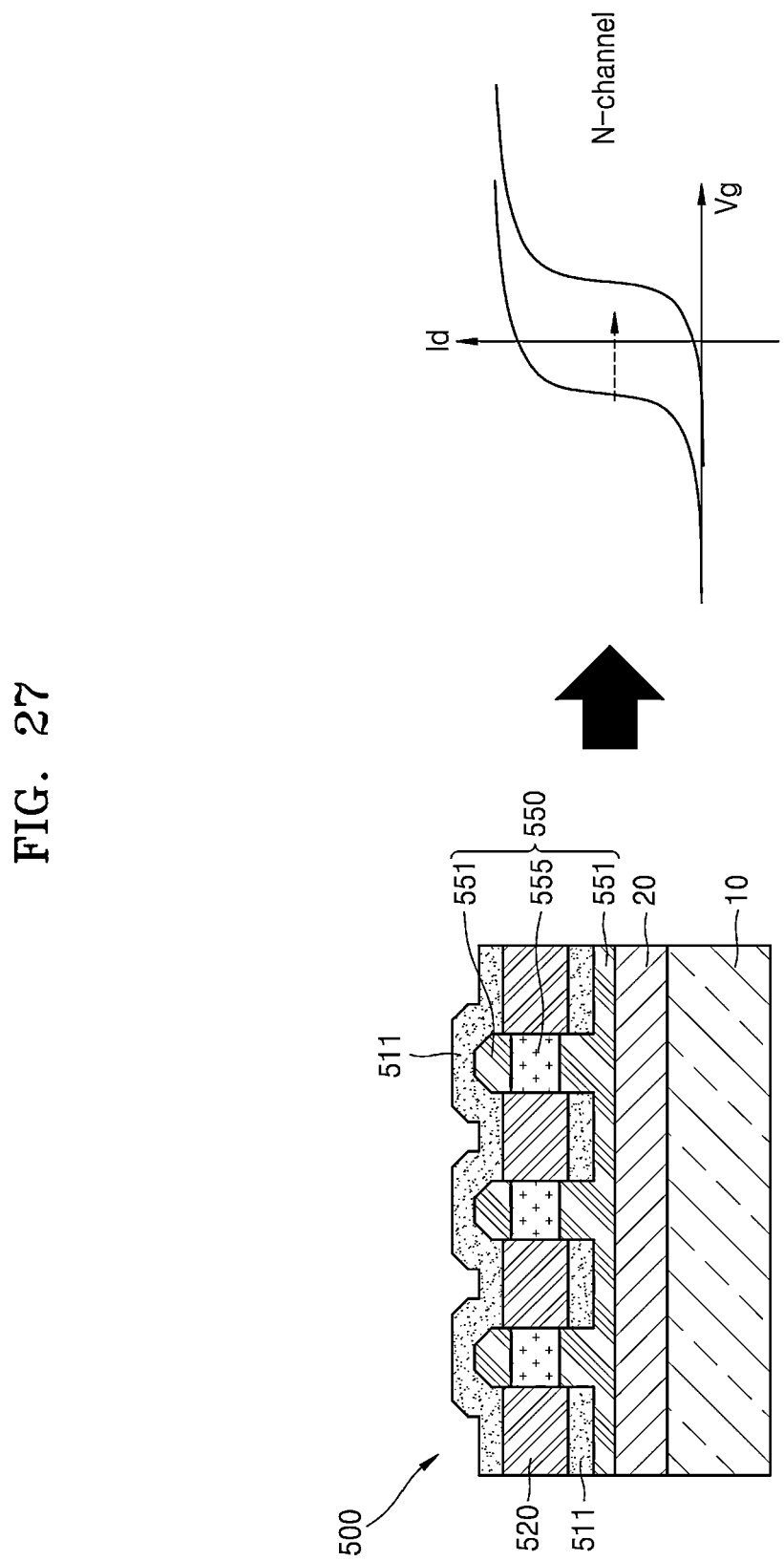
FIG. 27 is a diagram showing a change in current flowing through a channel according to a gate voltage when a nitride semiconductor device according to another embodiment is prepared to implement an E-mode of an N-channel.

FIGS. 26 and 27 show a current-voltage characteristic according to a type of a channel layer when nitride semiconductor devices 400 and 500 according to another embodiment are provided to operate in an enhancement mode.

FIG. 26 shows a change in current flowing through a channel according to a gate voltage when the nitride semiconductor device 400 according to another embodiment is provided to implement a P-channel enhancement mode.

Referring to FIG. 26, the nitride semiconductor device 400 according to another embodiment may include a stack structure 450 of an n-type channel control layer 451-a p-type channel layer 455-an n-type channel control layer 451. The stack structure 450 of the n-type channel control layer 45-the p-type channel layer 455-the n-type channel control layer 451 may include, for example, nGaN-pGaN-nGaN.

A gate electrode 411 may be provided to form a contact of an ohmic contact type with the n-type channel control layer 451, and an insulator 420 may be formed on sidewalls of the p-type channel layer 455. The nitride semiconductor device 400 may be formed in a structure in which the gate electrode 411 forms a contact of an ohmic contact type with the n-type channel control layer 451 and is provided to form a Schottky contact with the p-type channel layer 455, and the insulator 420 is not applied. As in a graph of a gate voltage Vg and a drain current Id shown on the right-side of FIG. 26, the nitride semiconductor device 400 according to another embodiment may be implemented in an enhancement mode by controlling a thickness of doping concentration of an impurity of the p-type channel layer 455.

FIG. 27 shows a change in current flowing through a channel according to a gate voltage when the nitride semiconductor device 500 according to another embodiment is provided to implement an N-channel enhancement mode.

Referring to FIG. 27, the nitride semiconductor device 500 according to another embodiment may include a stack structure 550 of a p-type channel control layer 551-an n-type channel layer 555-a p-type channel control layer 551. The stack structure 550 of the p-type channel control layer 55-the n-type channel layer 555-the p-type channel control layer 551 may include, for example, pGaN-nGaN-pGaN.

A gate electrode 511 is provided to form a contact of an ohmic contact type with the p-type channel control layer 551, and an insulator 520 may be formed on sidewalls of the n-type channel layer 555. The nitride semiconductor device 500 may be formed in a structure in which the gate electrode 511 forms a contact of an ohmic contact type with the p-type channel control layer 551 and is provided to form a Schottky contact with the n-type channel layer 555, and the insulator 520 is not applied. As shown in a graph of a gate voltage Vg and a drain current Id shown on the right-side of FIG. 27, the nitride semiconductor device 500 according to another embodiment may be implemented in an enhancement mode by controlling a thickness of doping concentration of an impurity of the n-type channel layer 555.

As in FIGS. 26 and 27, when the thickness/concentration of the channel layers 455 and 555 are controlled to operate in an enhancement mode, the nitride semiconductor devices 400 and 500 according to the present embodiment may be applied as inverters, and may implement logic and monolithic integration.

For example, as shown in FIGS. 26 and 27, according to some example embodiments, because the nitride semiconductor devices 400 and 500 may be implemented as a p-type and an n-type, it is possible to simultaneously form p-type and n-type nitride semiconductor devices, and the nitride semiconductor devices 400 and 500 may be manufactured in an enhancement mode, and thus, a monolithic integration is possible by applying the nitride semiconductor devices 400 and 500 as logic circuits.

Figure 28:
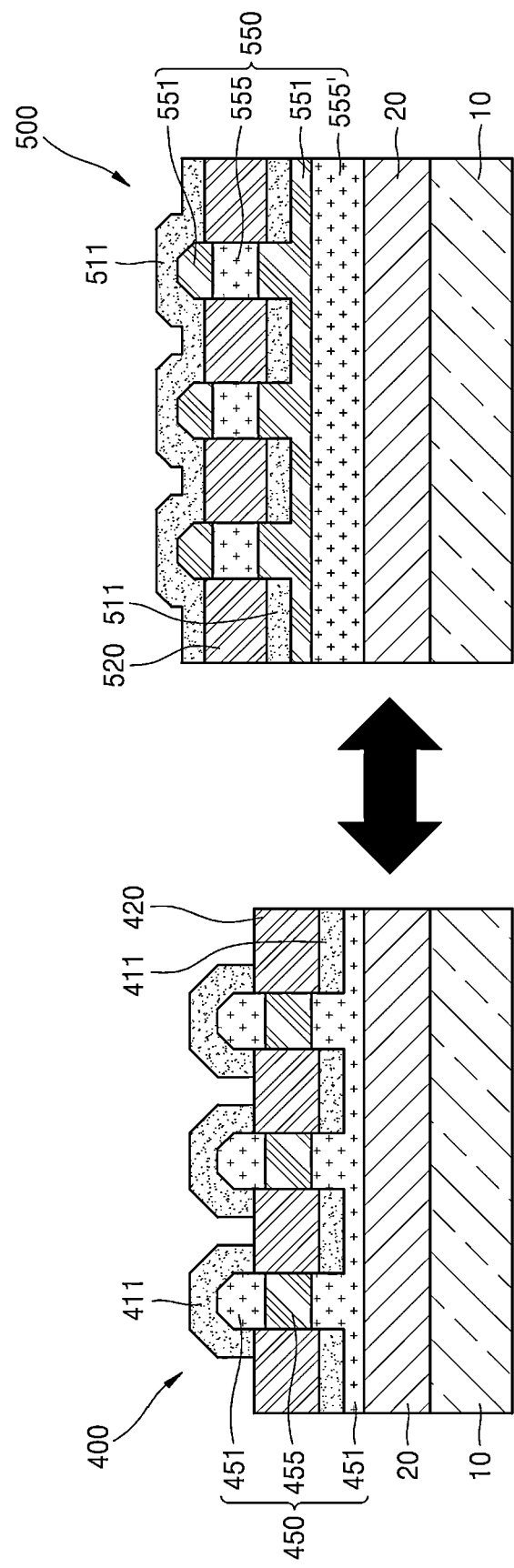
FIG. 28 is a diagram showing a monolithic structure of a nitride semiconductor device according to another embodiment.

For example, as in the modified example of FIG. 28, the nitride semiconductor device 400 implementing a P-channel enhancement mode and the nitride semiconductor device 500 implementing an N-channel enhancement mode may be monolithically integrated. For such monolithic integration, the nitride semiconductor device 500 implementing an N-channel enhancement mode may further include an n-type-dummy channel layer 555' between the high-resistance material layer 20 and the p-type channel control layer 551 compared to the nitride semiconductor device 400 implementing a P-channel enhancement mode.

At this point, in the monolithically integrated structure of the nitride semiconductor devices 400 and 500, the n-type channel control layer 451 adjacent to the high-resistance material layer 20 and the n-type-dummy channel layer 555', the p-type channel layer 455 and the p-type channel control layer 551, and the n-type channel control layer 451 which is the uppermost layer of the stack structure 450 and the n-type channel layer 555 of the stack structure 550 may each correspond to the same layer, and the stack structure 550 may further include a p-type channel control layer 551 on the uppermost layer.

Accordingly, in the monolithically integrated structure of the nitride semiconductor device 400 and 500, the stack structure 450 includes an n-type channel control layer 451-a p-type channel layer 455-an n-type channel control layer 451, and the stack structure 550 may include an n-type-dummy channel layer 555'-a p-type channel control layer 551-an n-type channel layer 555-a p-type channel control layer 551. For example, in the monolithically integrated structure of the nitride semiconductor device 400 and 500, the stack structure 450 may include nGaN-pGaN-nGaN, and the stack structure 550 may include nGaN-pGaN-nGaN-pGaN.

The monolithically integrated structure of the nitride semiconductor devices 400 and 500 may be formed, for example, as follows. That is, for example, a stack structure of an n-type first material layer-p-type second material layer-n-type third material layer-p-type fourth material layer may be formed on a high-resistance material layer 20 on a substrate 10. For example, a stack structure of nGaN-pGaN-nGaN-pGaN may be formed on the high-resistance material layer 20 on the substrate 10. With respect to the stack structure, a stack structure array having a structure in which the n-type first material layer has a protrusion may be formed by etching a partial depth of the n-type first material layer of the stack structure so that the implementation of a P-channel enhancement mode is possible in a region corresponding to the nitride semiconductor device 400, and a stack structure array having a structure in which the p-type second material layer has a protrusion may be formed by etching a partial depth of the p-type second material layer positioned on the n-type first material layer so that the implementation of an N-channel enhancement mode is possible in a region corresponding to the nitride semiconductor device 500. In addition, the uppermost p-type fourth material layer may be removed from a region corresponding to the nitride semiconductor device 400. In this way, in a state that the stack structure array of the nitride semiconductor devices 400 and 500 is formed, the gate electrodes 411 and 511 and the insulators 420 and 520 may be formed.

In the above, in the monolithically integrated structure of FIG. 28, the case where the nitride semiconductor device 400 is a p-type and the nitride semiconductor device 500 is an n-type has been described as an example, but the present embodiment is not limited thereto. For example, in the monolithically integrated structure, the nitride semiconductor device 400 may be implemented as an n-type and the nitride semiconductor device 500 may be implemented as a p-type, and in this case, the dummy channel layer 555' may be a p-type. For example, the stack structure 450 of the nitride semiconductor device 400 implemented as an n-type may include the p-type channel control layer 451, the n-type channel layer 455, and the p-type channel control layer 451. The stack structure 550 of the nitride semiconductor device 500 implemented as a p-type may include the p-type dummy channel layer 555', the n-type channel control layer 551, the p-type channel layer 555, and the n-type channel control layer 551 of the uppermost layer.

FIGS. 26, 27, and 28 show the nitride semiconductor devices 400 and 500 implemented in an enhancement mode and the implementations of the monolithic structure thereof as examples, but the structure of nitride semiconductor devices implemented in an enhancement mode is not limited thereto. For example, the nitride semiconductor device according to various embodiments described above may be applied as a nitride semiconductor device implementing an enhancement mode by controlling the thickness/concentration of the channel layer to be able to implement an enhancement mode.

Figure 29:
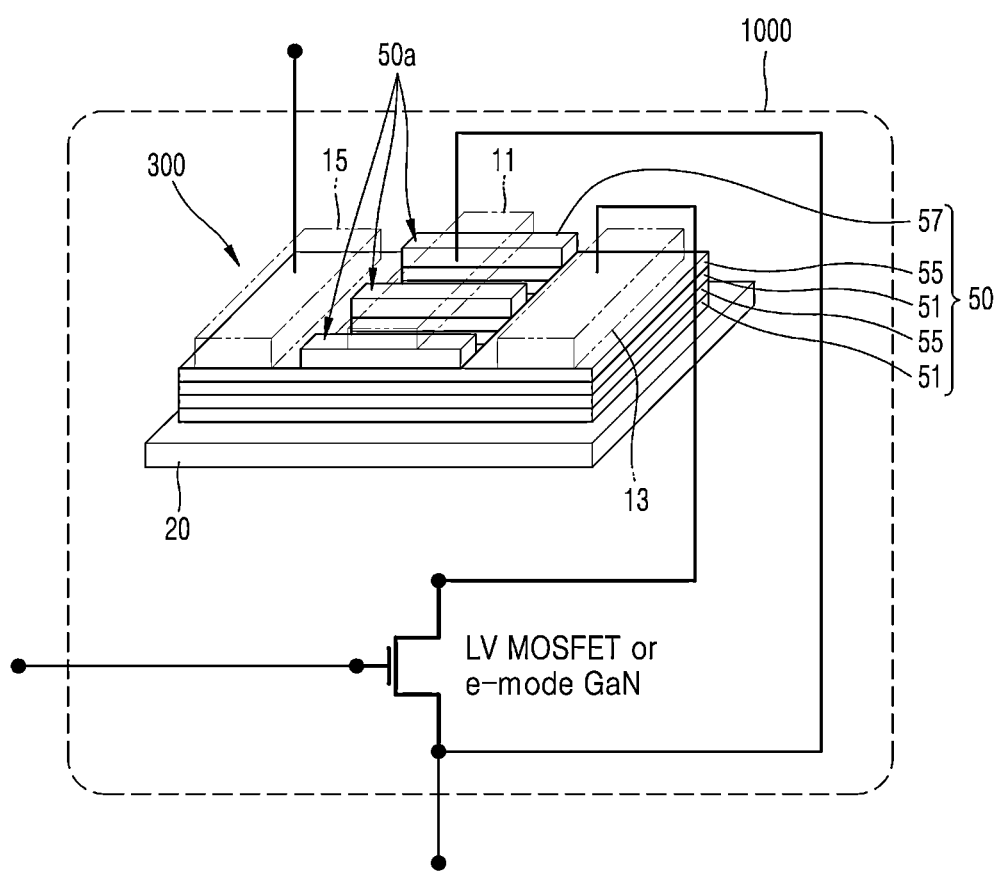
FIG. 29 is a diagram showing a cascode system to which a nitride semiconductor device according to some embodiments is applied.

FIG. 29 shows a cascode system 1000 to which a nitride semiconductor device according to some example embodiments is applied.

Referring to FIG. 29, the cascode system 1000, for example, may have a structure in which the nitride semiconductor device 300 according to another embodiment implemented in a depletion mode (D-mode) and a low voltage (LV) MOSFET or an e-mode nitride semiconductor device are integrated.

FIG. 29 shows an example of applying the nitride semiconductor device 300 according to the embodiment described with reference to FIG. 21 as a depletion mode nitride semiconductor device, but the embodiment is not limited thereto. The nitride semiconductor devices according to various example embodiments described above may be applied to implement a depletion mode. In addition, in FIG. 28, the enhancement mode nitride semiconductor device is indicated as an enhancement mode GaN device as an example, but example embodiments are not limited thereto. The nitride semiconductor devices according to various example embodiments described above may be applied to implement an enhancement mode. In addition, as shown in FIG. 28, an LV MOSFET may be applied instead of an enhancement mode nitride semiconductor device. At this point, the LV MOSFET may be, for example, an LV Si MOSFET.

When the nitride semiconductor devices according to the embodiments described above are formed, for example, as a GaN device including an n-channel, it may be formed as follows. After forming a high-resistance GaN layer on a substrate, GaN layers of p-type and n-type are alternately formed, a gate region is patterned through GaN etching for fin and field effect, and during etching, the etching may be performed up to the lowermost high-resistance GaN layer or the lowermost p-type GaN layer (channel control layer). Then, a gate electrode/source electrode/drain electrode may be formed. The gate electrode may form a contact of an ohmic contact type with the p-type GaN layer, and may form a Schottky contact or, for example, as an insulator of a dielectric material, etc. form an electrically insulated state with the n-type GaN layer (channel layer). The source electrode and the drain electrode may be formed to have an ohmic contact with the n-type GaN layer. Also, the source electrode and the drain electrode may be formed to form a Schottky contact or electrically insulated from the p-type GaN layer. The uppermost p-type GaN layer may be formed only in the gate region.

The nitride semiconductor device according to some example embodiments may be variously modified according to the kind of nitride and the channel type applied thereto. For example, when the nitride semiconductor device according to some example embodiments is formed as a GaN device having a p-channel, the p-type GaN layer forms a channel layer and the n-type GaN layer forms a channel control layer, and accordingly, the p-type GaN layer and the n-type GaN layer may be formed to be electrically connected or insulated from a gate electrode/source electrode/drain electrode. Alternatively or additionally, in the nitride semiconductor device according to some example embodiments, different kinds of nitride semiconductor materials are applied to the channel layer, a Group III-V compound semiconductor material is applied to the channel control layer, and the channel layer may be implemented as a p-type or an n-type.

According to the nitride semiconductor devices according to various example embodiments described above, for example, a depletion type, that is, a normally-on type transistor may be implemented by forming a p-type or n-type GaN channel control layer on upper and lower sides of the n-type or p-type GaN channel formed in a horizontal direction, and also, the nitride semiconductor device may be operated in an enhancement mode, that is, an normally-off type by controlling a thickness or doping concentration of an impurity of the channel layer, and thus, may be implemented as an inverter or the like.

Alternatively or additionally, because the nitride semiconductor devices according to various example embodiments described above use a field effect of a p-n junction, the current density is greater than, for example, a current density of an existing FinFET-type GaN device, and thus, the nitride semiconductor device may be used in a high-power RF amplifier. Alternatively or additionally, the current density may be increased by forming a channel in multiple layers, which may contribute to miniaturization of the size of a device.

In addition, according to the nitride semiconductor device according to various embodiments described above, when the nitride semiconductor device is implemented as a normally-off device, the nitride semiconductor device may be applied to a power conversion (DC to DC conversion) system. For example, when the nitride semiconductor device according to the embodiment is applied as a GaN switch device, a voltage of an output terminal may be lowered by allowing two GaN switches to alternately perform a turn on/off operation. For example, by applying the nitride semiconductor devices as GaN switch devices to a power conversion system, and allowing the two GaN switches to alternately perform a turn on/off operation, a high voltage, for example, of about 400V, may be converted into a low voltage, for example, of about 12V. During a switch on/off operation, a switching loss may occur due to simultaneous application of a high voltage and a high current. When the nitride semiconductor device according to some example embodiments is applied, the switching speed of the device is fast, and thus, the switching loss may be reduced, a switching frequency may be increased, and the size of an overall system may be reduced.

According to the nitride semiconductor device according to some example embodiments, because a field effect of a p-n junction is used, there is no restriction on a channel size for implementing turn-off or switching characteristics, and a channel may be implemented in a desired mode type. In addition, according to the nitride semiconductor device according to some example embodiments, it is possible to increase the size of a pattern compared to an existing Fin-type by using a field effect of a p-n junction, a process difficulty may be reduced, and the current density may be increased by forming a multi-layered channel.

It should be understood that various example embodiments described herein should be considered in a descriptive sense only and not for purposes of limitation. Descriptions of features or aspects within each embodiment should typically be considered as available for other similar features or aspects in other example embodiments, and features and embodiments are not necessarily mutually exclusive with one another. For example, some example embodiments may include features described with reference to one or more figures, and may also include features described with reference to one or more other figures. While one or more embodiments have been described with reference to the figures, it will be understood by those of ordinary skill in the art that various changes in form and details may be made therein without departing from the spirit and scope as defined by the following claims.

What is claimed is:

1. A nitride semiconductor device comprising:
a high-resistance material layer including a Group III-V compound semiconductor;
a first channel control layer on the high-resistance material layer and including a Group III-V compound semiconductor of a first conductivity type;
a channel layer on the first channel control layer and including a nitride semiconductor of a second conductivity type opposite to the first conductivity type; and
a gate electrode surrounding the first channel control layer and the channel layer, the gate electrode having a contact of an ohmic contact type with the first channel control layer.

2. A nitride semiconductor device comprising:
a high-resistance material layer including a Group III-V compound semiconductor;
a first channel control layer on the high-resistance material layer and including a Group III-V compound semiconductor of a first conductivity type;
a channel layer on the first channel control layer and including a nitride semiconductor of a second conductivity type opposite to the first conductivity type;
a gate electrode, the gate electrode having a contact of an ohmic contact type with the first channel control layer; and
a second channel control layer on the channel layer and including a Group III-V compound semiconductor of the first conductivity type,
wherein the first channel control layer, the channel layer and the second channel control layer correspond to a stack structure, and
the gate electrode surrounds the stack structure or has a contact of an ohmic contact type with at least one of the first channel control layer and the second channel control layer.

3. The nitride semiconductor device of claim 2,
wherein at least one of the high-resistance material layer, the first channel control layer, the channel layer, and the second channel control layer includes gallium nitride (GaN).

4. The nitride semiconductor device of claim 2,
wherein the high-resistance material layer includes a protrusion, and
the stack structure is on the protrusion of the high-resistance material layer.

5. The nitride semiconductor device of claim 4,
wherein the high-resistance material layer includes a plurality of protrusions having a stripe shape, and
the stack structure is on each of the plurality of protrusions of the high-resistance material layer and includes a plurality of stack structure arrays.

6. The nitride semiconductor device of claim 2,
wherein the first channel control layer adjacent to the high-resistance material layer includes a plurality of protrusions having a stripe shape, and
the stack structure is on each of the plurality of protrusions of the first channel control layer and includes a plurality of stack structure arrays.

7. The nitride semiconductor device of claim 6,
wherein the stack structure includes a plurality of first channel control layers and a plurality of channel layers by repeatedly stacking the first channel control layer and the channel layer, the plurality of protrusions are on a first channel control layer closest to the high-resistance material layer among the plurality of first channel control layers, and
the second channel control layer is an uppermost layer of the stack structure.

8. The nitride semiconductor device of claim 7,
wherein at least one of the gate electrode and the channel layer have a contact of a Schottky contact type, or the gate electrode and the channel layer provides electrical insulation.

9. The nitride semiconductor device of claim 7,
wherein the plurality of channel layers have same thickness, or at least one channel layer of the plurality of channel layers has a different thickness than at least another of the plurality of channel layers.

10. The nitride semiconductor device of claim 2,
wherein the stack structure includes a plurality of first channel control layers and a plurality of channel layers by repeatedly stacking the first channel control layer and the channel layer, and
the second channel control layer is an uppermost layer of the stack structure.

11. The nitride semiconductor device of claim 10,
wherein at least one of the gate electrode and the channel layer are a contact of a Schottky contact type, or the gate electrode and the channel layer provide electrical insulation.

12. The nitride semiconductor device of claim 10,
wherein the plurality of channel layers have same thickness, or at least one channel layer of the plurality of channel layers has a different thickness than at least another channel layer of the plurality of channel layers.

13. The nitride semiconductor device of claim 1, further comprising:
a source electrode and a drain electrode, the source electrode and the drain electrode both having an ohmic contact with the channel layer.

14. The nitride semiconductor device of claim 1,
wherein at least one of the high-resistance material layer, the first channel control layer, and the channel layer includes GaN.

15. The nitride semiconductor device of claim 1,
wherein at least one of the gate electrode and the channel layer have a contact of a Schottky contact type, or electrical insulation.

16. The nitride semiconductor device of claim 1,
wherein the first channel control layer and the channel layer have a stack structure, and
the gate electrode surrounds the stack structure or has a contact of an ohmic contact type with the first channel control layer.

17. The nitride semiconductor device of claim 16,
wherein the high-resistance material layer includes a protrusion, and
the stack structure is on the protrusion of the high-resistance material layer.

18. The nitride semiconductor device of claim 17,
wherein the high-resistance material layer includes a plurality of protrusions in a stripe shape, and
the stack structure is on each of the plurality of protrusions of the high-resistance material layer, and includes a plurality of stack structure arrays.

19. A nitride semiconductor device comprising:
a high-resistance material layer including a Group III-V compound semiconductor;

a first channel control layer on the high-resistance material layer and including a Group III-V compound semiconductor of a first conductivity type;

a channel layer on the first channel control layer and including a nitride semiconductor of a second conductivity type opposite to the first conductivity type;

a gate electrode, the gate electrode having a contact of an ohmic contact type with the first channel control layer; and wherein the first channel control layer and the channel layer have a stack structure, and the gate electrode surrounds the stack structure or has a contact of an ohmic contact type with the first channel control layer, wherein the first channel control layer includes a plurality of protrusions having stripe shape, and the channel layer is respectively on a plurality of protrusions of the first channel control layer, and includes a plurality of stack structure arrays.

20. The nitride semiconductor device of claim 1, wherein a p-type nitride semiconductor device and an n-type nitride semiconductor device are monolithically integrated, and any one of the p-type nitride semiconductor device and the n-type nitride semiconductor device includes a dummy-channel layer between the high-resistance material layer and the first channel control layer.

* * * * *